(12) United States Patent
Takayama et al.

(10) Patent No.: US 12,733,170 B2
(45) Date of Patent: Sep. 8, 2026

(54) SEMICONDUCTOR MEMORY DEVICE AND METHOD OF MANUFACTURING SEMICONDUCTOR MEMORY DEVICE

(71) Applicant: Kioxia Corporation, Tokyo (JP)

(72) Inventors: Karin Takayama, Yokkaichi (JP); Hiroshi Kanno, Yokkaichi (JP); Hideto Takekida, Nagoya (JP)

(73) Assignee: Kioxia Corporation, Tokyo (JP)

( * ) Notice: Subject to any disclaimer, the term of this patent is extended or adjusted under 35 U.S.C. 154(b) by 717 days.

(21) Appl. No.: 18/180,447

(22) Filed: Mar. 8, 2023

(65) Prior Publication Data

US 2023/0247838 A1 Aug. 3, 2023

Related U.S. Application Data

(63) Continuation of application No. PCT/JP2020/040139, filed on Oct. 26, 2020.

(51) Int. Cl.
*H10B 43/27* (2023.01)
*H10B 41/27* (2023.01)
(Continued)

(52) U.S. Cl.
CPC ............ *H10B 43/35* (2023.02); *H10B 41/27* (2023.02); *H10B 41/35* (2023.02); *H10B 41/41* (2023.02); *H10B 43/27* (2023.02); *H10B 43/40* (2023.02)

(58) Field of Classification Search
CPC ........ H10B 43/27; H10B 41/27; H10B 41/30; H10B 43/30; H10B 43/20; H10B 41/20
See application file for complete search history.

(56) References Cited

U.S. PATENT DOCUMENTS 9,711,524 B2 * 7/2017 Shoji ...................... H10B 43/10
10,361,218 B2 7/2019 Arai
(Continued)

FOREIGN PATENT DOCUMENTS

JP 2012-23091 A 2/2012
JP 2018-142654 A 9/2018
JP 2020-506542 A 2/2020

OTHER PUBLICATIONS

International Search Report issued Dec. 8, 2020 in PCT/JP2020/040139 filed on Oct. 26, 2020, 2 pages.

*Primary Examiner* — Christopher A Johnson
(74) *Attorney, Agent, or Firm* — Oblon, McClelland, Maier & Neustadt, L.L.P.

(57) ABSTRACT

A semiconductor memory device includes: a stack having conductive layers and insulating layers, the conductive layers including a first select gate line connected to a gate of a first select transistor, a word line provided above the first select gate line and connected to a gate of a memory transistor, and a second select gate line provided above the word line and connected to a gate of a second select transistor; a core insulating layer having a top surface lower than a top surface of the second select gate line; a semiconductor layer having a first semiconductor part having channel formation regions of the transistors and a second semiconductor part on the top surface of the core insulating layer; and a memory layer between the semiconductor layer and the stack. The first semiconductor part has an impurity semiconductor region containing an impurity and overlapping with the second select gate line.

5 Claims, 26 Drawing Sheets

(51) Int. Cl.

| | |
|---|---|
| ***H10B 41/35*** | (2023.01) |
| ***H10B 41/41*** | (2023.01) |
| ***H10B 43/35*** | (2023.01) |
| ***H10B 43/40*** | (2023.01) |

(56) References Cited

U.S. PATENT DOCUMENTS

| | | | | |
|---|---|---|---|---|
| 2012/0008400 | A1 | 1/2012 | Fukuzumi et al. | |
| 2013/0100741 | A1 | 4/2013 | Choi et al. | |
| 2016/0204122 | A1 | 7/2016 | Shoji et al. | |
| 2018/0211710 | A1 | 7/2018 | Saito et al. | |
| 2018/0323213 | A1 | 11/2018 | Arai | |
| 2019/0296046 | A1 | 9/2019 | Arai | |
| 2019/0333581 | A1 | 10/2019 | Diep et al. | |
| 2021/0159169 | A1* | 5/2021 | Zhao ...................... | H10B 43/10 |
| 2021/0375912 | A1* | 12/2021 | Zhang .................... | H10B 41/35 |

* cited by examiner

FIG. 2

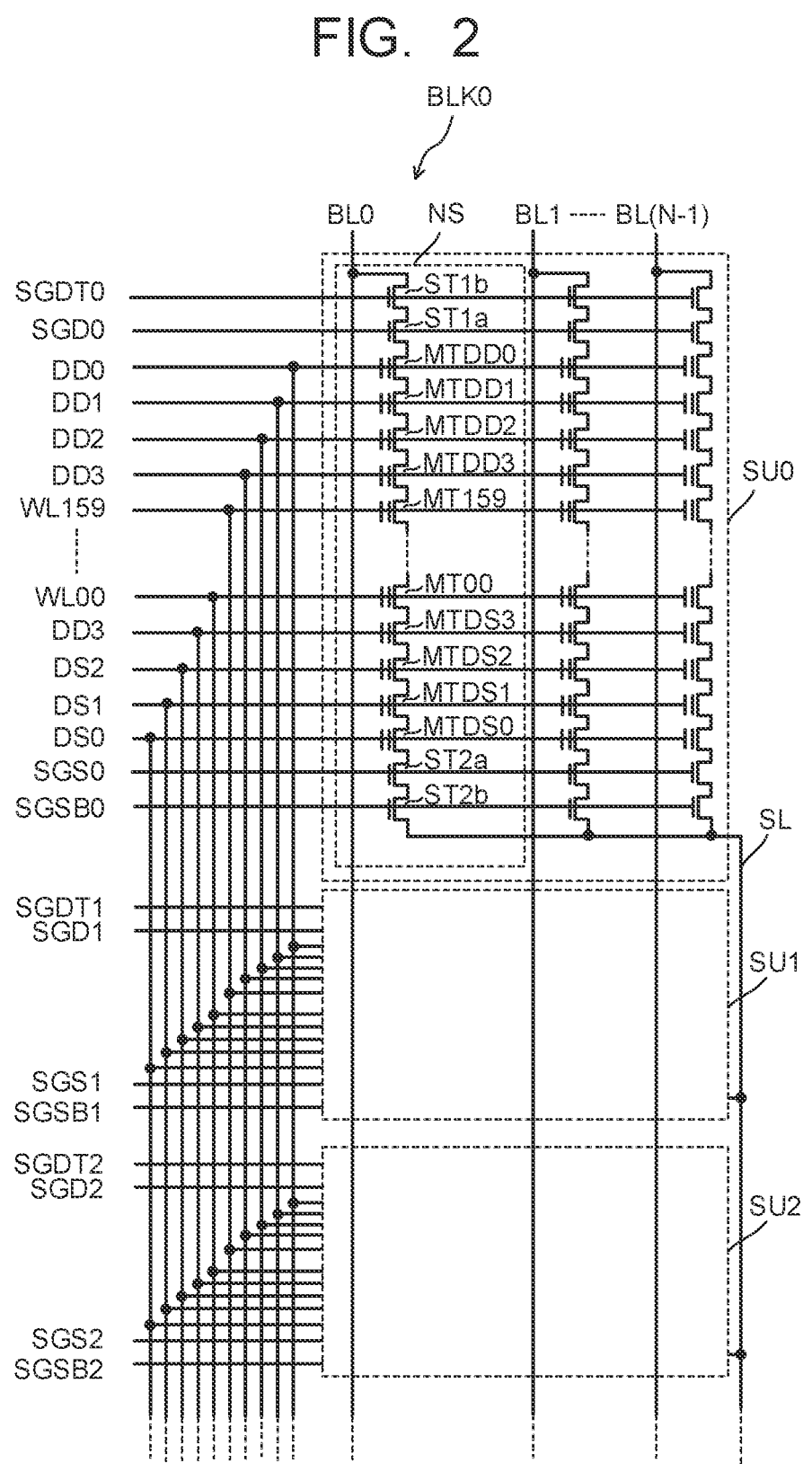

BLK0
BL0
NS
BL1 ---- BL(N-1)
SGDT0
SGD0
DD0
DD1
DD2
DD3
WL159
WL00
DD3
DS2
DS1
DS0
SGS0
SGSB0
ST1b
ST1a
MTDD0
MTDD1
MTDD2
MTDD3
MT159
MT00
MTDS3
MTDS2
MTDS1
MTDS0
ST2a
ST2b
SU0
SL
SGDT1
SGD1
SGS1
SGSB1
SU1
SGDT2
SGD2
SGS2
SGSB2
SU2

234
234a
234b
232
233
231
241
236
235
261(BL)
252
251
223
222
221(SGDT0)
221(SGDT1)
221(SGDT2)
221(SGD0)
221(SGD1)
221(SGD2)
221(DD0)
221(DD1)
221(DD2)
221(DD3)
221(WL159)
221(WL00)
221(DS3)
221(DS2)
221(DS1)
221(DS0)
221(SGS2)
221(SGS1)
221(SGS0)
221(SGSB4)
221(SGSB3)
221(SGSB2)
221(SGSB1)
221(SGSB0)
214
213
212
SL
211
203
202
201
100
Z
Y
X
TR_N
TR_P

START
FORMING STACK
S1-1
FORMING OPENING
S1-2
FORMING MEMORY LAYER
S1-3
FORMING FIRST SEMICONDUCTOR PART
S1-4
FORMING CORE INSULATING LAYER
S1-5
ETCH-BACK OF CORE INSULATING LAYER
S1-6
FORMING SECOND SEMICONDUCTOR PART
S1-7
ETCH-BACK OF SECOND SEMICONDUCTOR PART
S1-8
IMPLANTATING FIRST IMPURITY
S1-9
FORMING CAP LAYER
S1-10
ETCH-BACK
S1-11
IMPLANTATING SECOND IMPURITY
S1-12
REPLACING
S1-13
END

START
FORMING STACK
S2-1
FORMING OPENING
S2-2
FORMING MEMORY LAYER
S2-3
FORMING SEMICONDUCTOR PART
S2-4
FORMING CORE INSULATING LAYER
S2-5
ETCH-BACK OF CORE INSULATING LAYER
S2-6
FORMING IMPURITY-CONTAINING CAP LAYER
S2-7
ETCH-BACK
S2-8
IMPLANTATING SECOND IMPURITY
S2-9
IMPLANTATING FIRST IMPURITY
S2-10
REPLACING
S2-11
END 232b
234d
233b
231b
223b
222b
222b
222b
222b
222b
224
233
232
231
223
222
222
221a2
221a2
221a2
221a2
221a2
221a2
236
234a
235
221a
221a
Z
Y
X 232b
234d
233b
231b
223b
222b
222b
222b
222b
222b
224
233
232
231
223
222
222
221a2
221a2
221a2
221a2
221a2
221a2
236
234a
235
221a
221a
Z
Y
X

SEMICONDUCTOR MEMORY DEVICE AND METHOD OF MANUFACTURING SEMICONDUCTOR MEMORY DEVICE

CROSS-REFERENCE TO RELATED APPLICATIONS

This application is a continuation application of International Application No. PCT/JP2020/040139 filed on Oct. 26, 2020; the entire contents of which are incorporated herein by reference.

FIELD

Embodiments relate to a semiconductor memory device and a method of manufacturing the semiconductor memory device.

BACKGROUND

In recent years, known examples of semiconductor memory device have peripheral circuits below a memory cell array.

BRIEF DESCRIPTION OF THE DRAWINGS

FIG. 2 is a circuit diagram illustrating a circuit configuration of a memory cell array.

FIG. 5 is a view illustrating an example of a concentration profile of impurity elements of a semiconductor layer 234.

FIG. 6 is a cross-sectional schematic view illustrating a structure example of a memory cell in a comparative example.

FIG. 42 is a cross-sectional schematic view for explaining an example of a second etch-back step S3-17.

DETAILED DESCRIPTION

Figure 1:
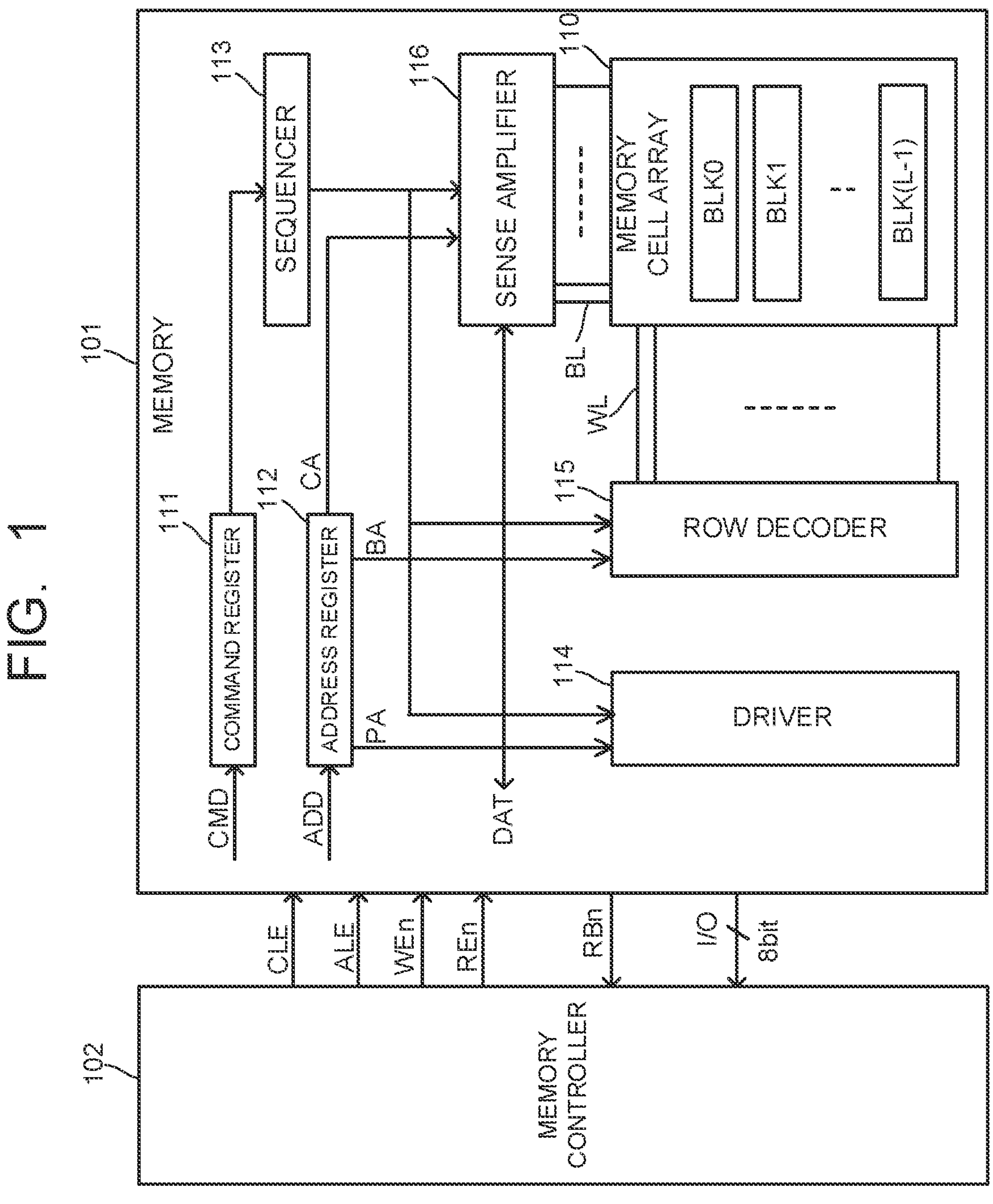
FIG. 1 is a block diagram illustrating a configuration example of a semiconductor memory device.

A semiconductor memory device in an embodiment includes a peripheral circuit provided on a surface of a semiconductor substrate; and a memory cell array provided above the peripheral circuit. The memory cell array includes: a stack having conductive layers and insulating layers, each conductive layer and each insulating layer being alternately stacked and extending in a first direction, the conductive layers including a first select gate line connected to a gate of a first select transistor, a word line provided above the first select gate line and connected to a gate of a memory transistor, and a second select gate line provided above the word line and connected to a gate of a second select transistor; a core insulating layer extending in a second direction intersecting the first direction, the core insulating layer having a top surface lower than a top surface of the second select gate line with respect to the surface of the semiconductor substrate; a semiconductor layer extending in the second direction, the semiconductor layer having a first semiconductor part and a second semiconductor part, the first semiconductor part having channel formation regions of the memory transistor and the first and second select transistors, and the second semiconductor part being provided on the top surface of the core insulating layer; and a memory layer provided between the semiconductor layer and the stack in the first direction. The first semiconductor part has an impurity semiconductor region containing an impurity element and overlapping with the second select gate line.

Embodiments will be hereinafter explained with reference to the drawings. A relation between the thickness and planar dimension of each of components illustrated in the drawings, a thickness ratio among the components, and so on may be different from actual ones. Further, in the embodiments, substantially the same components are denoted by the same reference signs and an explanation thereof is omitted where appropriate.

FIG. 1 is a block diagram illustrating a configuration example of a semiconductor memory device. The semiconductor memory device includes a memory 101 and a memory controller 102.

The memory 101 includes a memory cell array 110, a command register 111, an address register 112, a sequencer 113, a driver 114, a row decoder 115, and a sense amplifier 116.

The memory cell array 110 includes a plurality of blocks BLK (BLK0 to BLK(L−1) (L is a natural number of 2 or more). The block BLK is a set of a plurality of memory transistors MT which store data in a nonvolatile manner.

The memory cell array 110 is connected to the sense amplifier 116 via a plurality of bit lines BL. The memory cell array 110 includes a plurality of word lines WL and is connected to the row decoder 115 via the plurality of word lines WL as will be explained later. The memory transistors MT (memory cells) are each connected to one of the plurality of word lines WL and one of the plurality of bit lines BL.

The command register 111 holds a command signal CMD received from the memory controller 102. The command signal CMD includes, for example, command data causing the sequencer 113 to execute a read operation, a write operation, and an erase operation.

The address register 112 holds an address signal ADD received from the memory controller 102. The address signal ADD includes, for example, a block address BA, a page address PA, and a column address CA. For example, the block address BA, the page address PA, and the column address CA are used for selecting a block BLK, a word line WL, and a bit line BL respectively.

The sequencer 113 controls the operation of the memory 101. For example, the sequencer 113 controls the driver 114, the row decoder 115, the sense amplifier 116, and so on based on the command signal CMD held in the command register 111 to execute the operations such as the read operation, the write operation, and the erase operation.

The driver 114 generates a voltage used for the read operation, the write operation, the erase operation, and so on. For example, the driver 114 then applies the generated voltage to a signal line corresponding to the word line WL selected based on the page address PA held in the address register 112.

The row decoder 115 selects a corresponding one of the blocks BLK in the memory cell array 10 in accordance with the block address BA held in the address register 112. Then, the row decoder 115, for example, transfers the voltage applied to the signal line corresponding to the selected word line WL, to the selected word line WL in the selected block BLK.

The sense amplifier 116 in the write operation applies a desired voltage to each bit line BL according to write data DAT received from the memory controller 102. Further, the sense amplifier 116 in the read operation determines data stored in the memory cell based on the voltage of the bit line BL and transfers the determination result as read data DAT to the memory controller 102.

The communication between the memory 101 and the memory controller 102 supports the NAND interface protocol, for instance. For example, the communication between the memory 101 and the memory controller 102 uses a command latch enable signal CLE, an address latch enable signal ALE, a write enable signal WEn, a read enable signal REn, a ready/busy signal RBn, and an input/output signal I/O.

The command latch enable signal CLE indicates that the input/output signal I/O received by the memory 101 is the command signal CMD. The address latch enable signal ALE indicates that the received signal I/O is the address signal ADD. The write enable signal WEn is a signal that commands the memory 101 to receive the input/output signal I/O. The read enable signal REn is a signal that commands the memory 101 to output the input/output signal I/O.

The ready/busy signal RBn is a signal that notifies the memory controller 102 whether the memory 101 is in a ready state in which it accepts a command from the memory controller 102 or is in a busy state in which it does not accept the command.

The input/output signal I/O is a signal with, for example, an eight-bit width, and can include signals such as the command signal CMD, the address signal ADD, and the write data signal DAT.

The combination of the memory 101 and memory controller 102 explained above may form one semiconductor memory device by a combination of them. Examples of such a semiconductor memory device include a memory card such as an SD card and a solid state drive (SSD).

Next, a circuit configuration example of the memory cell array 110 will be explained. FIG. 2 is a circuit diagram illustrating a circuit configuration of the memory cell array 110. FIG. 2 illustrates the block BLK0 as an example, and the configurations of the other blocks BLK are also the same.

The block BLK includes a plurality of string units SU. The string units SU each include a plurality of NAND strings NS. FIG. 2 illustrates three string units SU (SU0 to SU2), but the number of the string units SU is not particularly limited.

The NAND strings NS are each connected to one of the plurality of bit lines BL (BL0 to BL(N−1) (Nis a natural number of 2 or more)). The NAND strings NS each include the memory transistors MT, dummy memory transistors MTDD, dummy memory transistors MTDS, select transistors ST1, and select transistors ST2.

The memory transistors MT each include a control gate and a charge storage layer, and hold data in a nonvolatile manner. FIG. 2 illustrates a plurality of memory transistors MT (MT00 to MT159), but the number of the memory transistors MT is not particularly limited.

The dummy memory transistor MTDD and the dummy memory transistor MTDS each include a control gate and a charge storage layer. The dummy memory transistor MTDD and the dummy memory transistor MTDS each have the same structure as that of the memory transistor MT but are not used for holding data.

The memory transistor MT, the dummy memory transistor MTDD, and the dummy memory transistor MTDS each may be of a MONOS-type transistor using an insulating film as the charge storage layer or may be of an FG-type transistor using a conductive layer as the charge storage layer. Hereinafter, the MONOS-type transistor will be explained as an example in this embodiment.

The select transistors ST1 are each used for selecting a string unit SU at the time of the various operations. FIG. 2 illustrates a plurality of select transistors ST1 (ST1*a*, ST1*b*), but the number of the select transistors ST1 is not particularly limited.

The select transistors ST2 are each used for selecting a string unit SU at the time of the various operations. FIG. 2 illustrates a plurality of select transistors ST2 (ST2*a*, ST2*b*), but the number of the select transistors ST2 is not particularly limited.

In each of the NAND strings NS, a drain of the select transistor ST1 is connected to the corresponding bit line BL. A source of the select transistor ST1 is connected to one end of the serially connected memory transistors MT. The other end of the serially connected memory transistors MT is connected to a drain of the select transistor ST2.

In the same block BLK, the sources of the select transistors ST2 are connected to a source line SL. Gates of the select transistors ST1*a* of the string units SU are connected to corresponding select gate lines SGD respectively. Gates of the select transistors ST1*b* are connected to corresponding select gate lines SGDT respectively. Control gates of the memory transistors MT are connected to corresponding the word lines WL respectively. Control gates of the dummy memory transistors MTDD are connected to corresponding dummy word lines DD respectively. Control gates of the dummy memory transistors MTDS are connected to corresponding dummy word lines DS respectively. Gates of the select transistors ST2*a* are connected to corresponding select gate lines SGS. Gates of the select transistors ST2*b* are connected to corresponding select gate lines SGSB.

In the plurality of blocks BLK, the plurality of NAND strings NS assigned the same column address CA are connected to the bit line BL. The source line SL is connected among the plurality of blocks BLK.

Figure 3:
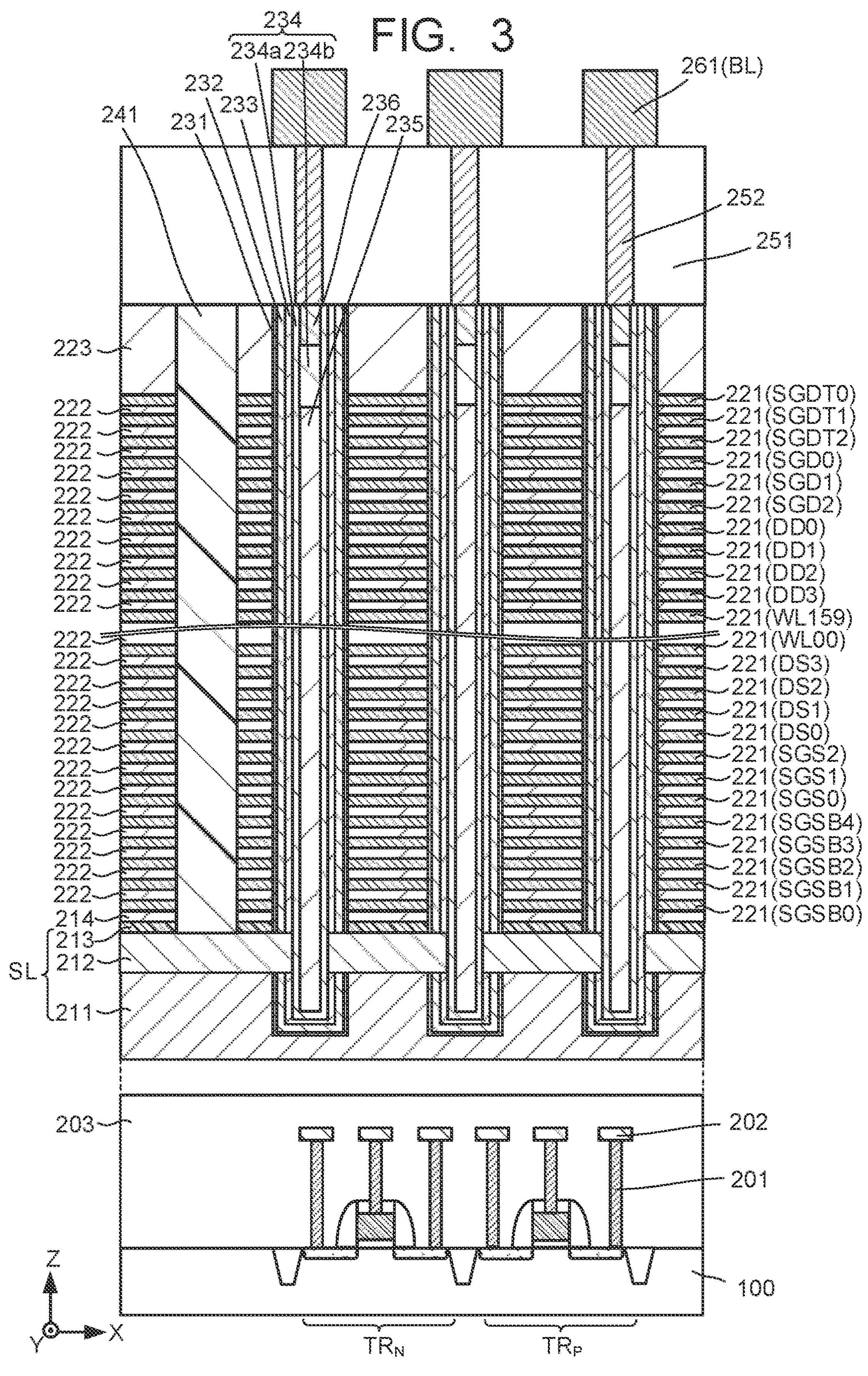
FIG. 3 is a cross-sectional schematic view for explaining a cross-sectional structure example of the semiconductor memory device.

Next, a cross-sectional structure example of the semiconductor memory device will be explained. FIG. 3 is a cross-sectional schematic view for explaining a cross-sectional structure example of the semiconductor memory device, and illustrates an X-axis direction along a surface of a semiconductor substrate 100, a Y-axis direction substantially perpendicular to the X-axis along the surface, and a Z-axis direction substantially perpendicularly to the surface.

The semiconductor memory device illustrated in FIG. 3 includes peripheral circuits such as the command register 111, the address register 112, the sequencer 113, the driver 114, the row decoder 115, and the sense amplifier 116 below the memory cell array 110.

The semiconductor memory device illustrated in FIG. 3 includes a field-effect transistor $TR_N$ and a field-effect transistor $TR_P$ provided in the semiconductor substrate 100, conductive layers 201, conductive layers 202, an insulating layer 203, a conductive layer 211, a conductive layer 212, a conductive layer 213, an insulating layer 214, conductive layers 221, insulating layers 222, a block insulating film 231, a charge storage film 232, a tunnel insulating film 233, a semiconductor layer 234, a core insulating layer 235, a cap layer 236, an insulating layer 241, an insulating layer 251, a contact layer 252, and a conductive layer 261. The conductive layer 211, the conductive layer 212, the conductive layer 213, the insulating layer 214, the conductive layers 221, the insulating layers 222, the block insulating film 231, the charge storage film 232, the tunnel insulating film 233, the semiconductor layer 234, the core insulating layer 235, the cap layer 236, and the insulating layer 241 constitute the memory cell array 110.

The field-effect transistor $TR_N$ and the field-effect transistor $TR_P$ are provided below the memory cell array 110. The field-effect transistor $TR_N$ is an N-channel type transistor. The field-effect transistor $TR_P$ is a P-channel type transistor. Each of the field-effect transistor $TR_N$ and the field-effect transistor $TR_P$ forms any of the aforementioned peripheral circuits.

Each of the plurality of conductive layers 201 constitutes a contact plug. The plurality of conductive layers 202 constitute one wiring layer, and the respective conductive layers 202 constitute respective wirings of the aforementioned wiring layer. Each of the conductive layers 202 is connected to any of a gate, a source, and a drain of the field-effect transistor $TR_N$ or the field-effect transistor $TR_P$ via the conductive layer 201, for example. The conductive layers 201 and the conductive layers 202 each contain a metal material.

The insulating layer 203 insulates a region between the field-effect transistor $TR_N$ and the field-effect transistor $TR_P$, a region between the plurality of conductive layers 201, a region between the plurality of conductive layers 202, and so on. The insulating layer 203 contains silicon oxide, for example. The field-effect transistor $TR_N$ and the field-effect transistor $TR_P$ are connected to the memory cell array 110 via not only the conductive layers 201 and the conductive layers 202 but also other wiring layers and contact plugs, but illustration of these will be omitted here for the sake of convenience.

The conductive layer 211, the conductive layer 212, and the conductive layer 213 constitute the source line SL. Each of the conductive layer 211, the conductive layer 212, and the conductive layer 213 is, for example, a polysilicon layer containing doped phosphorus. Further, the conductive layer 212 is provided between the conductive layer 211 and the conductive layer 213, penetrates the block insulating film 231, the charge storage film 232, and the tunnel insulating film 233 along the X-axis direction, and comes into contact with the semiconductor layer 234. Electrical connection with the conductive layers constituting the source line SL is formed on the side of the semiconductor layer (semiconductor layer 234) constituting the channel of the memory cell in this embodiment, but electrical connection with the conductive layers constituting the source line SL may be formed on the bottom surface of the semiconductor layer constituting the channel of the memory cell in another configuration.

The insulating layer 214 is provided on the conductive layer 213. The insulating layer 214 contains, for example, silicon oxide.

The plurality of conductive layers 221 and the plurality of insulating layers 222 are each alternatively stacked to constitute a stack. The plurality of conductive layers 221 constitute select gate lines SGSB0 to SGSB4, select gate lines SGS0 to SGS2, dummy word lines DS0 to DS3, word lines WL00 to WL159, dummy word lines DD0 to DD3, select gate lines SGD0 to SGD2, and select gate lines SGDT0 to SGDT2, respectively. The conductive layers 221 contain a metal material such as tungsten. The insulating layers 222 contain, for example, silicon oxide.

An insulating layer 223 is provided on the stack including the conductive layers 221 and the insulating layers 222. The insulating layer 223 includes, for example, tetraethylorthosilicate (TEOS).

The block insulating film 231, the charge storage film 232, the tunnel insulating film 233, the semiconductor layer 234, and the core insulating layer 235 constitute a memory pillar. The components of the memory pillar extend along the Z-axis direction. One memory pillar corresponds to one NAND string NS. Further, the block insulating film 231, the charge storage film 232, and the tunnel insulating film 233 constitute a memory layer between the semiconductor layer 234 and the stack of the conductive layers 221 and the insulating layers 222.

The block insulating film 231, the tunnel insulating film 233, and the core insulating layer 235 contain, for example, silicon oxide. The charge storage film 232 contains, for example, silicon nitride.

More specifically, a hole corresponding to the memory pillar is formed through the plurality of conductive layers 221. On a side of the hole, the block insulating film 231, the charge storage film 232, and the tunnel insulating film 233 are stacked in order. Subsequently, the semiconductor layer 234 is formed so that its side is in contact with the tunnel insulating film 233 and the conductive layer 212.

The semiconductor layer 234 penetrates the stack of the conductive layers 221 and the insulating layers 222 along the Z-axis direction, and is connected to the source line SL and the bit line BL. The semiconductor layer 234 has channel formation regions of the select transistors ST1, the select transistors ST2, the memory transistors MT, the dummy memory transistors MTDS, and the dummy memory transistors MTDD. Therefore, the semiconductor layer 234 functions as a signal line connecting current paths of the select transistors ST1, the select transistors ST2, the memory transistors MT, the dummy memory transistors MTDS, and the dummy memory transistors MTDD.

The semiconductor layer 234 includes a semiconductor part 234*a* and a semiconductor part 234*b*. The semiconductor part 234*a* is in contact with a surface of the tunnel insulating film 233. The semiconductor part 234*b* is provided on a top surface of the core insulating layer 235. The semiconductor part 234*a* and the semiconductor part 234*b* contain, for example, polysilicon. The semiconductor layer 234 may also be formed by crystallizing an amorphous silicon film, for example. An interface between the semiconductor part 234*a* and the semiconductor part 234*b* is not always clearly observed. The height of the top surface of the semiconductor part 234*b* is preferably lower than the height of upper ends of the block insulating film 231, the charge storage film 232, and the tunnel insulating film 233 with respect to the semiconductor substrate 100.

The core insulating layer 235 is provided on the inner side of the semiconductor part 234*a*. The core insulating layer 235 extends along the Z-axis. The core insulating layer 235 has the top surface at a position lower than the height of a top surface of the select gate line SGDT0 with respect to the surface of the semiconductor substrate 100. The top surface of the core insulating layer 235 is covered with the semiconductor part 234*b*.

The cap layer 236 is provided on the semiconductor part 234*b*, and is in contact with the semiconductor part 234*a*. The cap layer 236 contains, for example, silicon oxide, or polysilicon containing doped phosphorus. For example, the cap layer 236 made of an insulating layer such as a silicon oxide layer, can prevent diffusion of an impurity element. When the cap layer 236 is made of an insulating layer, an impurity element such as phosphorus or arsenic may be implanted into a surface of the cap layer 236. Further, the cap layer 236 made of a semiconductor layer such as polysilicon containing doped phosphorus, can reduce a connection resistance between the cap layer 236 and the contact layer 252.

The insulating layer 241 penetrates the stack along the Z-axis direction, and comes into contact with the source line SL.

The insulating layer 251 is provided above the stack of the conductive layers 221 and the insulating layers 222 and on the insulating layer 223. The insulating layer 251 contains TEOS, for example. The contact layer 252 constitutes a contact plug. The conductive layer 261 is in contact with the cap layer 236 via the contact layer 252. The conductive layer 261 constitutes the bit line BL. The contact layer 252 and the conductive layer 261 each contain a metal material.

Each of intersections of the memory pillar and the conductive layers 221 constituting word lines WL functions as each memory transistor MT. Each of intersections of the memory pillar and the conductive layers 221 constituting dummy word lines DD functions as each dummy memory transistor MTDD. Each of intersections of the memory pillar and the conductive layers 221 constituting dummy word lines DS functions as each dummy memory transistor MTDS. Each of intersections of the memory pillar and the conductive layers 221 constituting select gate lines SGD functions as each select transistor ST1*a*. Each of intersections of the memory pillar and the conductive layers 221 constituting select gate lines SGDT functions as each select transistor ST1*b*. Each of intersections of the memory pillar and the conductive layers 221 constituting select gate lines SGS functions as each select transistor ST2*a*. Each of intersections of the memory pillar and the conductive layers 221 constituting select gate lines SGSB functions as each select transistor ST2*b*.

In the semiconductor memory device in this embodiment, the channel formation region of the memory transistor MT (semiconductor layer 234*a*) is not directly connected to the semiconductor substrate 100. Accordingly, an erase operation of the memory transistor is performed by applying a reverse bias voltage between a gate and a drain of at least one select transistor such as the select transistor ST1*b* or the select transistor ST2*b* to cause Gate Induced Drain Leakage (GIDL). The GIDL enables injecting holes via a channel of the memory transistor MT to eliminate a charge of the charge storage film 232.

Here, the erase operation will be explained. As one example, block erase will be explained here. The block erase is performed by selecting one block BLK and performing an erase operation to the selected block BLK.

The erase operation includes an erase pulse application operation and an erase verify operation roughly. The erase pulse application operation is applying an erase pulse for lowering a threshold voltage of the memory transistor MT. The erase verify operation is determining whether or not the threshold voltage of the memory transistor MT has been smaller than a targeted value as a result of performing the erase pulse application operation. The erase operation enables lowering the threshold voltage of the memory transistor MT to an erase level by repeating the combination of the erase pulse application operation and the erase verify operation.

Figure 4:
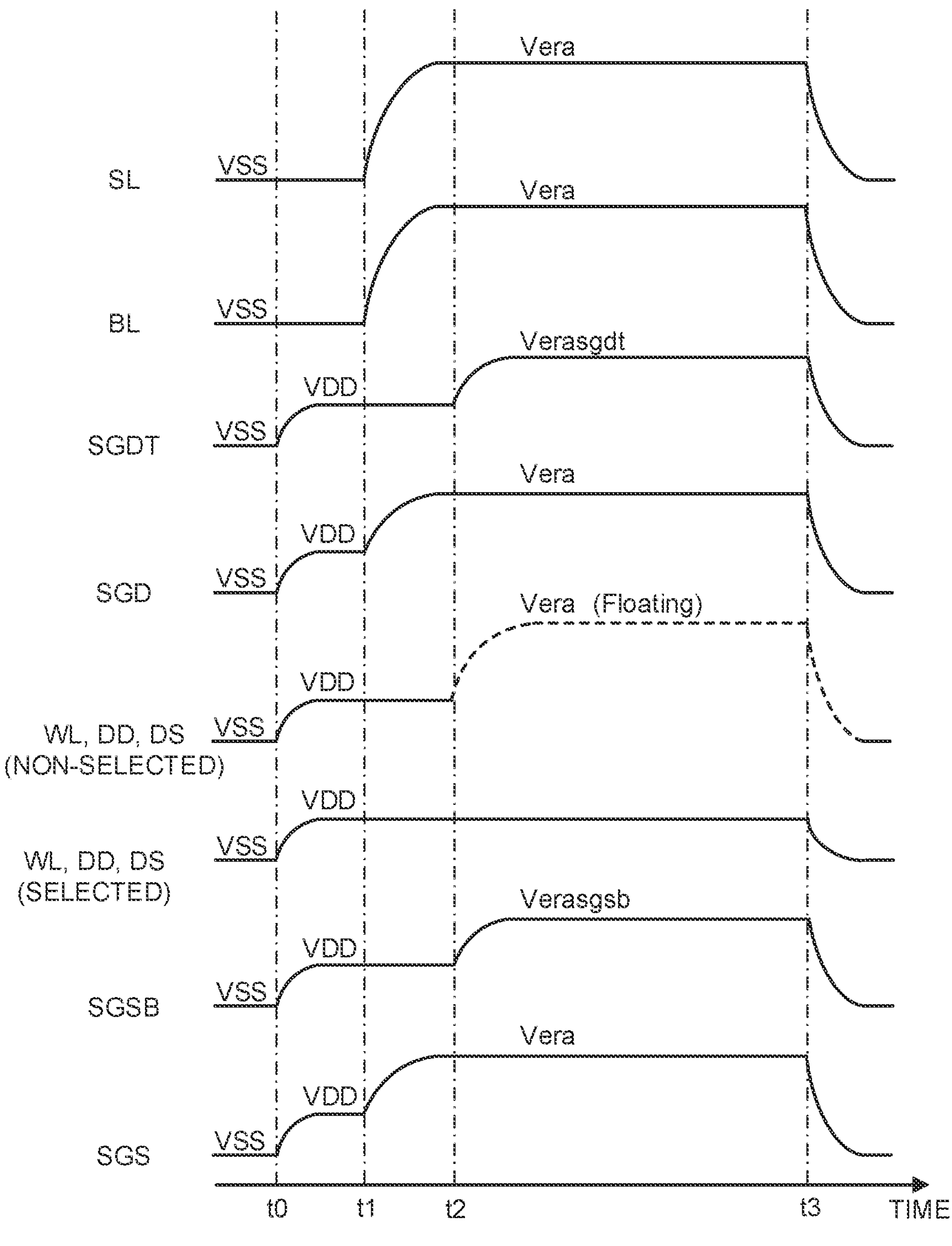
FIG. 4 is a timing chart illustrating voltages of respective wirings when performing erase pulse application during a block erase operation.

FIG. 4 is a timing chart illustrating voltages of respective wirings when performing the erase pulse application during the block erase operation. At a time t0, the row decoder 115 illustrated in FIG. 1 applies, for example, a voltage VDD being a power supply voltage to the select gate lines SGDT, SGD, SGSB, and SGS, the word lines WL and the dummy word lines DD, DS of a block BLK which is an erase target (hereinafter, also described as "selected block BLK"). Further, the row decoder 115 applies the voltage VDD to the word lines WL and the dummy word lines DD, DS of a block BLK which is not the erase target (hereinafter, also described as "non-selected block BLK"). The voltages of the word lines WL and the dummy word lines DD, DS do not have to be the voltage VDD.

The voltages of the word lines WL and the dummy word lines DD, DS may also be lower than the voltage VDD so that the holes generated by the GIDL are injected into the charge storage films 232 of the corresponding memory transistors MT and dummy memory transistors MTDD, MTDS. Further, the row decoder 115 does not have to apply the voltage VDD to the word lines WL and the dummy word lines DD, DS of the non-selected block BLK, and the row decoder 115 may set the word lines WL and the dummy word lines DD, DS of the non-selected block BLK into a floating state.

At a time t1, a voltage Vera is applied to the source line SL and the bit lines BL. The voltage Vera is a high voltage for causing the GIDL. Further, the row decoder 115 applies the voltage Vera to the select gate lines SGD and SGS in order to prevent the injection of holes into the charge storage films 232 of the select transistors ST1*a* and the select transistors ST2*a*. Voltages different from the voltage Vera may also be respectively applied to the select gate lines SGD and SGS. In this case, the voltages to be applied to the select gate lines SGD and SGS may be different from each other. For example, voltages higher than the voltage VDD may also be respectively applied to the select gate lines SGD and SGS.

During a period from a time t2 to a time t3, the row decoder 115 respectively applies a voltage Verasgdt and a voltage Verasgsb to the select gate lines SGDT and SGSB of the selected block BLK. The voltage Verasgdt is a high voltage for causing the GIDL in the select transistor ST1*b*, and is a voltage lower than the voltage Vera and higher than the voltage VDD. The voltage Verasgsb is a high voltage for causing the GIDL in the select transistor ST2*b*, and is a voltage lower than the voltage Vera and higher than the voltage VDD. The voltage Verasgdt and the voltage Verasgsb may be different voltages from each other or the same voltage. This generates the GIDL flowing between gates and drains of the select transistors ST1*b* and ST2*b* of the selected block BLK. The holes generated by the GIDL are injected into the charge storage films 232 of the memory transistors MT and the dummy memory transistors MTDD, MTDS in the selected block BLK. In other words, the holes are supplied from the bit line BL side and the source line SL side to the memory transistors MT and the dummy memory transistors MTDD, MTDS (data is erased).

During the period from the time t2 to the time t3, the row decoder 115 sets the word lines WL and the dummy word lines DD, DS of the non-selected block BLK into a floating state. Since the word lines WL and the dummy word lines DD, DS of the non-selected block BLK are in the floating state, the voltages thereof are increased, for example, to the voltage Vera due to coupling with the semiconductor part 234*a* (channel) to which the voltage Vera is applied. For this reason, the holes are not supplied to the memory transistors MT and the dummy memory transistors MTDD, MTDS of the non-selected block BLK (data is not erased).

After that, at the time t3, a refresh operation is performed, and a voltage VSS is applied to the respective wirings. The above is the explanation of the erase operation.

Figures 5, 6:
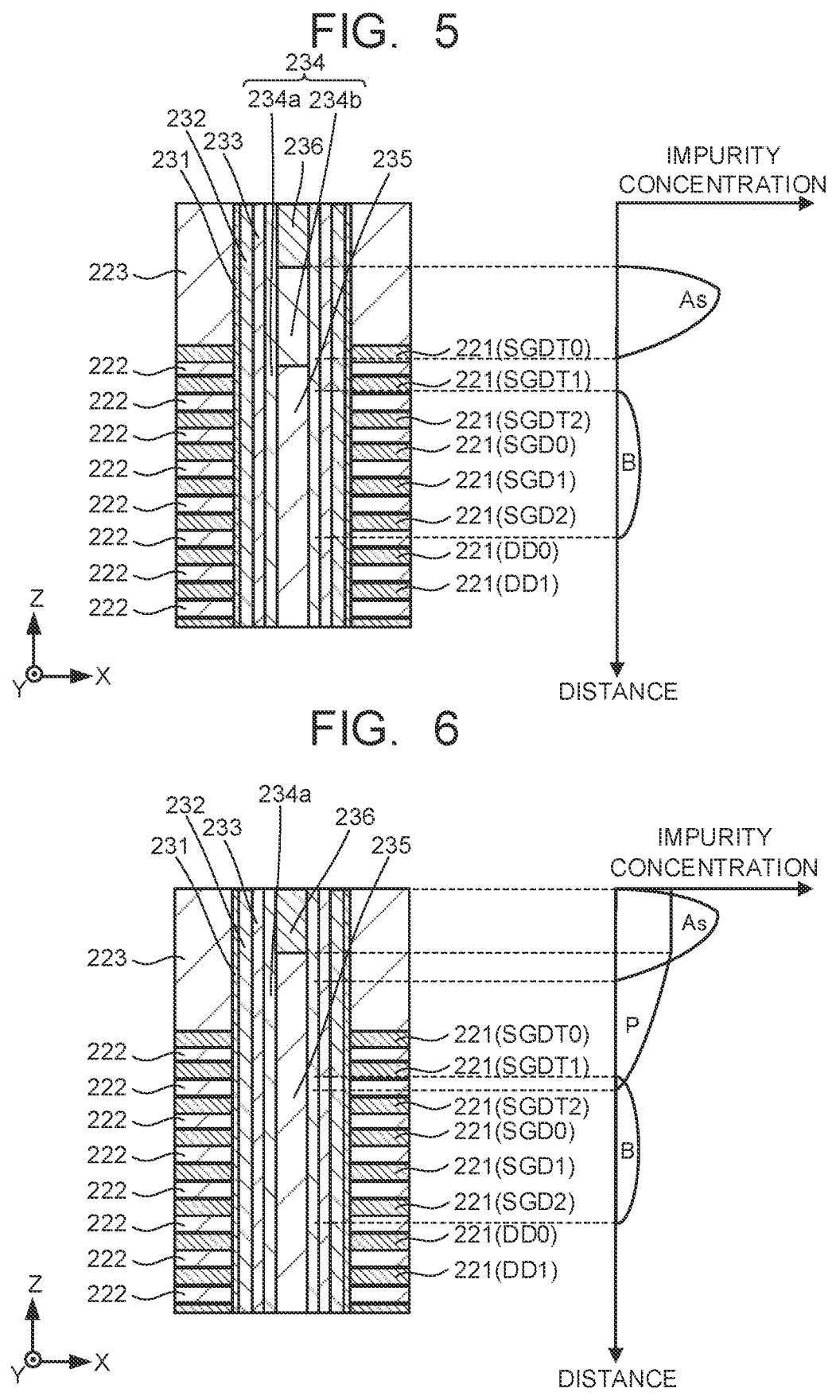

For the above erase operation, it is preferable to diffuse impurity elements such as phosphorus and arsenic in the semiconductor part 234*a*, to thereby form a junction region. FIG. 5 is an enlarged view of a part of FIG. 3 and is a view illustrating an example of a concentration profile of the impurity elements of the semiconductor layer 234.

The concentration profile illustrated in FIG. 5 indicates that arsenic (As) is implanted into a region of the semiconductor part 234*a* overlapping with the select gate line SGDT0 and the semiconductor part 234*b*. Further, the semiconductor part 234*b* has a concentration peak of arsenic. More specifically, a region of the semiconductor part 234*a* overlapping with the select gate line SGDT0, and the semiconductor part 234*b* have impurity semiconductor regions containing arsenic. Arsenic is shorter than phosphorus in diffusion length and can thus be reduced in diffusion variation. The impurity semiconductor regions may be formed in a manner to overlap with the plurality of select gate lines SGDT. Further, a region of the semiconductor part 234*a* overlapping with the select gate lines SGDT0, SGDT1 may have an impurity semiconductor region containing phosphorus.

Further, the concentration profile illustrated in FIG. 5 indicates that boron (B) is implanted into a region of the semiconductor part 234*a* overlapping with the select gate lines SGDT2, SGD0, SGD1, SGD2. This indicates that the region of the semiconductor part 234*a* overlapping with the select gate lines SGDT2, SGD0, SGD1, SGD2 has an impurity semiconductor region containing boron. This can reduce the variation in threshold voltage. Boron does not always have to be implanted.

FIG. 6 is a cross-sectional schematic view illustrating a structure example of a memory cell in a comparative example. Explanation of the same portions as those in FIG. 5 will be omitted. FIG. 6 illustrates a core insulating layer 235 having a top surface higher than the top surface of the select gate line SGDT0 with respect to the semiconductor substrate 100. A concentration profile illustrated in FIG. 6 indicates that phosphorus (P) is implanted in a region of the semiconductor part 234*a* overlapping with the select gate lines SGDT0, SGDT1. This indicates that the region of the semiconductor part 234*a* overlapping with the select gate lines SGDT0, SGDT1 has an impurity semiconductor region containing phosphorus. When the cap layer 236 is made of a semiconductor layer of polysilicon containing doped phosphorus, an impurity semiconductor region containing phosphorus can be formed by diffusing the phosphorus contained in the semiconductor layer by a later-explained heat treatment. In this case, as illustrated in FIG. 6 the concentration of phosphorus gradually decreases from a region of the semiconductor part 234*a* adjacent to the cap layer 236 toward the region of the semiconductor part 234*a* overlapping with the select gate lines SGDT0, SGDT1.

As illustrated in FIG. 6, when the top surface of the core insulating layer 235 is located at a position higher than the top surface of the select gate line SGDT0, arsenic cannot be sufficiently diffused in the semiconductor part 234*a*, and the position of the concentration profile of arsenic shifts to a position higher than that in FIG. 5, so that it is difficult to cause the impurity element to reach the region of the semiconductor part 234*a* overlapping with the select gate line SGDT.

In contrast to the above, the formation of the semiconductor memory device in this embodiment includes forming the top surface of the core insulating layer 235 lower than the top surface of the select gate line SGDT, thereby to cause the impurity element to easily reach the region of the semiconductor part 234*a* overlapping with the select gate line SGDT and thus form the impurity semiconductor region. This can increase the GIDL and thus provide a semiconductor memory device capable of an easy erase operation.

Figure 7:
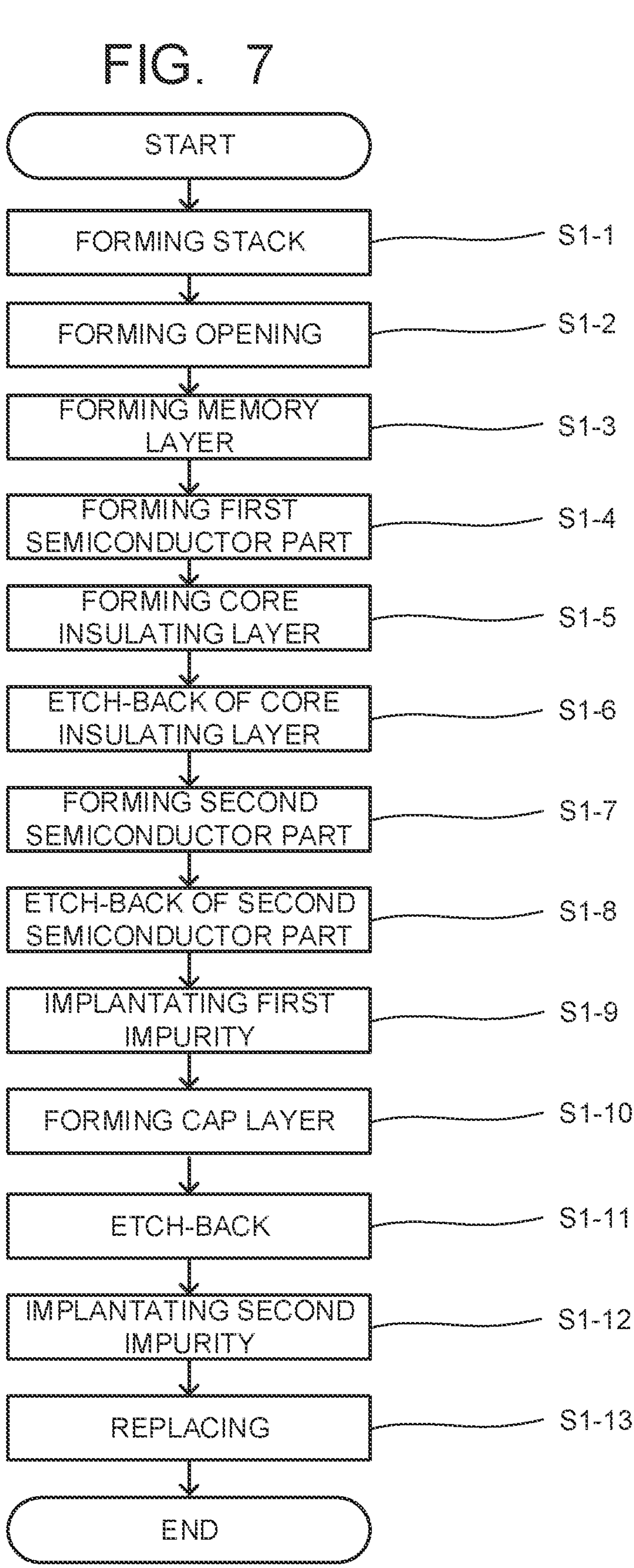
FIG. 7 is a flowchart for explaining a method example of forming the memory cell.

Next, a method example of forming the memory cell in an example of a method of manufacturing the semiconductor memory device in this embodiment will be explained. FIG. 7 is a flowchart for explaining the method example of forming the memory cell.

The method example of forming the memory cell includes, as illustrated in FIG. 7, a stack formation step S1-1, an opening formation step S1-2, a memory layer formation step S1-3, a first semiconductor part formation step S1-4, a core insulating layer formation step S1-5, a core insulating layer etch-back step S1-6, a second semiconductor part formation step S1-7, a second semiconductor part etch-back step S1-8, a first impurity implantation step S1-9, a cap layer formation step S1-10, an etch-back step S1-11, a second impurity implantation step S1-12, and a replacing step S1-13. These steps are not limited to the order of steps illustrated in FIG. 7.

[Stack Formation Step S1-1]

Figure 8:
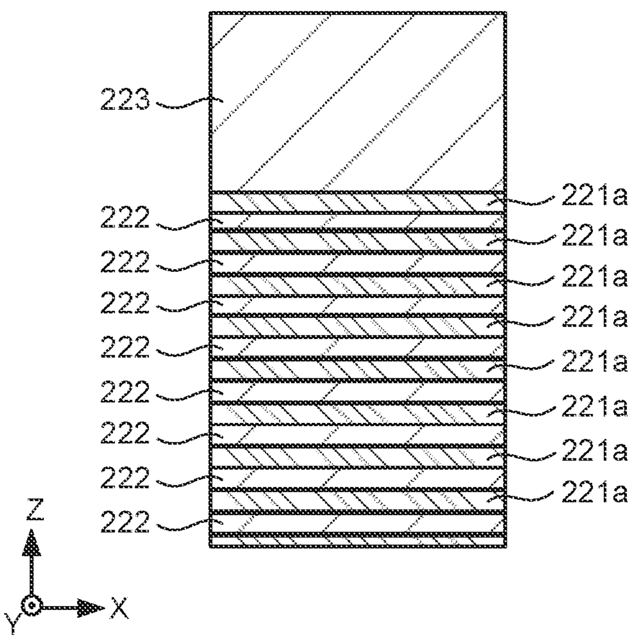
FIG. 8 is a cross-sectional schematic view for explaining an example of a stack formation step S1-1.

FIG. 8 is a cross-sectional schematic view for explaining an example of the stack formation step S1-1, and illustrates a part of an X-Z cross section of the memory cell including an X-axis of the semiconductor substrate 100, a Y-axis perpendicular to the X-axis, and a Z-axis perpendicular to the X-axis and the Y-axis. The stack formation step S1-1 includes alternately stacking a sacrificial layer 221*a* and the insulating layer 222 as illustrated in FIG. 8 to form the stack having a plurality of sacrificial layers 221*a* and a plurality of insulating layers 222, and forming the insulating layer 223 on the stack. The sacrificial layer 221*a* and the insulating layer 222 can be formed using, for example, the chemical vapor deposition method (CVD).

The stack is provided above the peripheral circuits provided on the surface of the semiconductor substrate 100 illustrated in FIG. 3 and on the insulating layer 214. The sacrificial layers 221*a* are provided for forming the conductive layers 211. The sacrificial layers 221*a* extend, for example, in the X-axis direction together with the insulating layers 222. The sacrificial layers 221*a* contain, for example, silicon nitride.

[Opening Formation Step S1-2]

Figure 9:
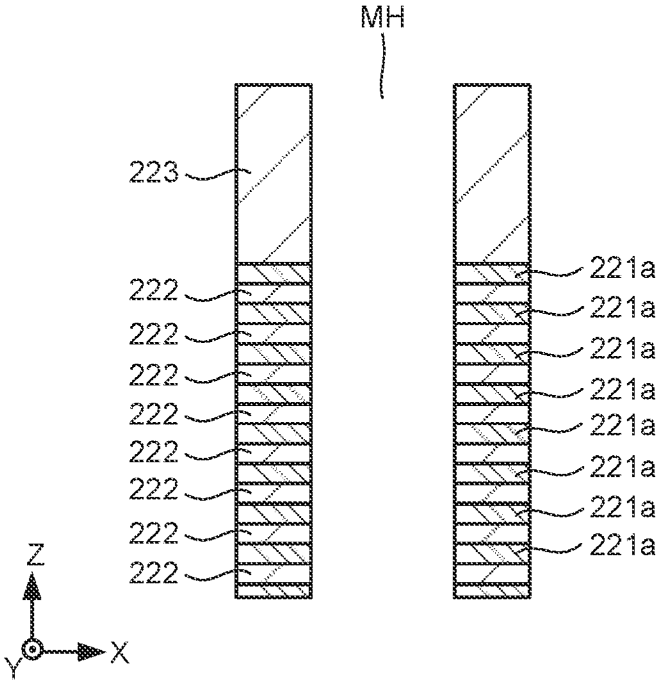
FIG. 9 is a cross-sectional schematic view for explaining an example of an opening formation step S1-2.

FIG. 9 is a cross-sectional schematic view for explaining an example of the opening formation step S1-2, and illustrates a part of the X-Z cross section of the memory cell. The opening formation step S1-2 includes partially removing the stack to form an opening MH (memory hole) extending in the Z-axis direction. The stack can be partially removed using, for example, a photolithography technique and reactive ion etching (RIE).

Figure 10:
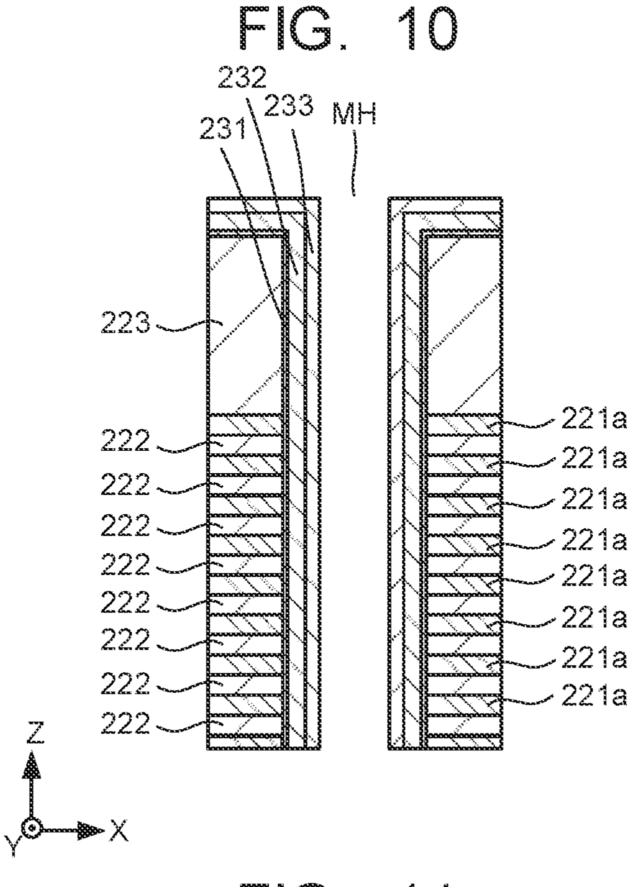
FIG. 10 is a cross-sectional schematic view for explaining an example of a memory layer formation step S1-3.

[Memory Layer Formation Step S1-3]FIG. 10 is a cross-sectional schematic view for explaining an example of the memory layer formation step S1-3, and illustrates a part of the X-Z cross section of the memory cell. The memory layer formation step S1-3 includes forming the block insulating film 231, the charge storage film 232, and the tunnel insulating film 233 in order on an inner wall surface of the opening MH to form a memory layer. These films can be formed using the CVD or sputtering for example.

[First Semiconductor Part Formation Step S1-4]

Figure 11:
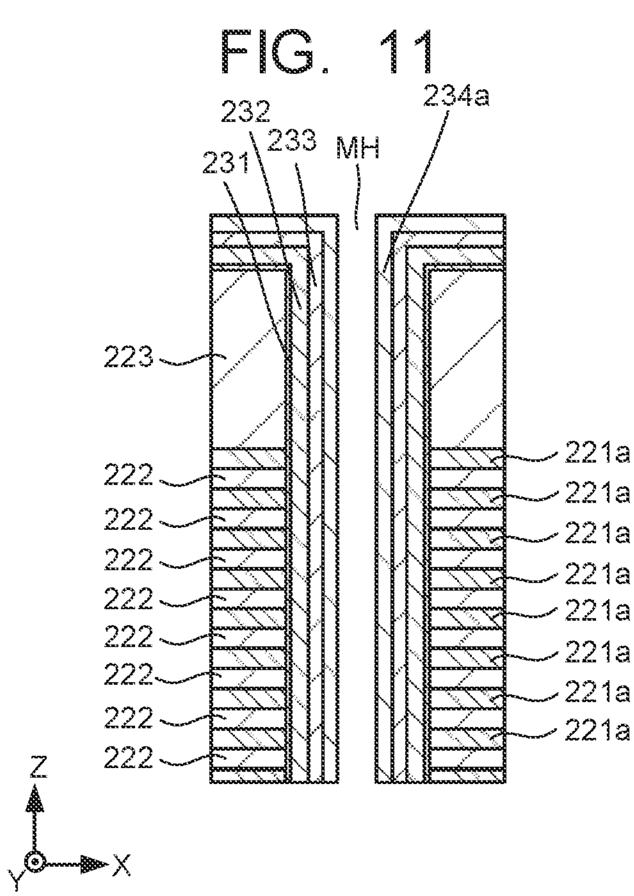
FIG. 11 is a cross-sectional schematic view for explaining an example of a first semiconductor part formation step S1-4.

FIG. 11 is a cross-sectional schematic view for explaining an example of the first semiconductor part formation step S1-4, and illustrates a part of the X-Z cross section of the memory cell. The first semiconductor part formation step S1-4 includes forming the semiconductor part 234*a* on the surface of the memory layer. The semiconductor part 234*a* can be formed using the CVD or the atomic layer deposition method (ALD), for example.

[Core Insulating Layer Formation Step S1-5]

Figure 12:
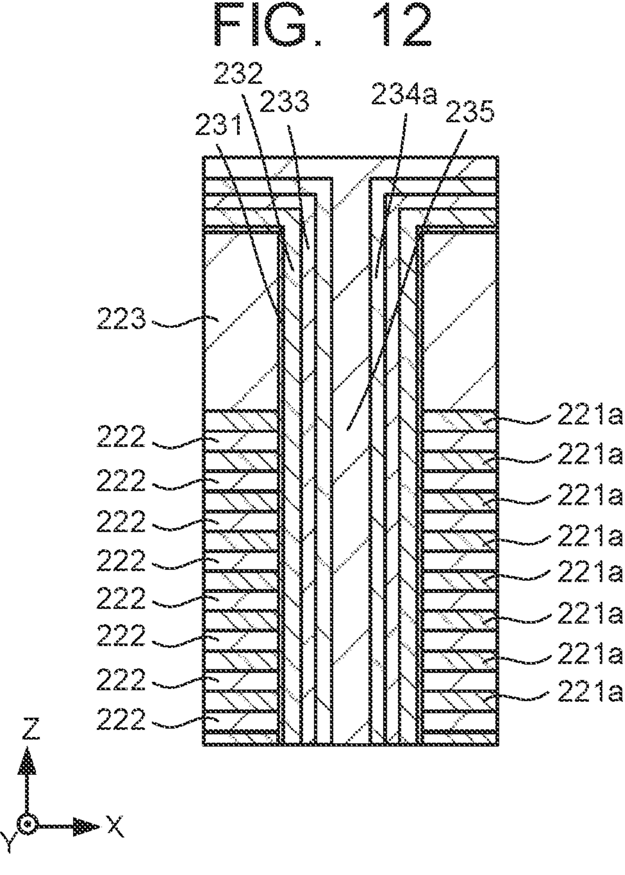
FIG. 12 is a cross-sectional schematic view for explaining an example of a core insulating layer formation step S1-5.

FIG. 12 is a cross-sectional schematic view for explaining an example of the core insulating layer formation step S1-5, and illustrates a part of the X-Z cross section of the memory cell. The core insulating layer formation step S1-5 includes forming the core insulating layer 235 which is in contact with the semiconductor part 234*a* and fills the opening MH. The core insulating layer 235 can be formed using the CVD or the ALD, for example.

[Core Insulating Layer Etch-Back Step S1-6]

Figure 13:
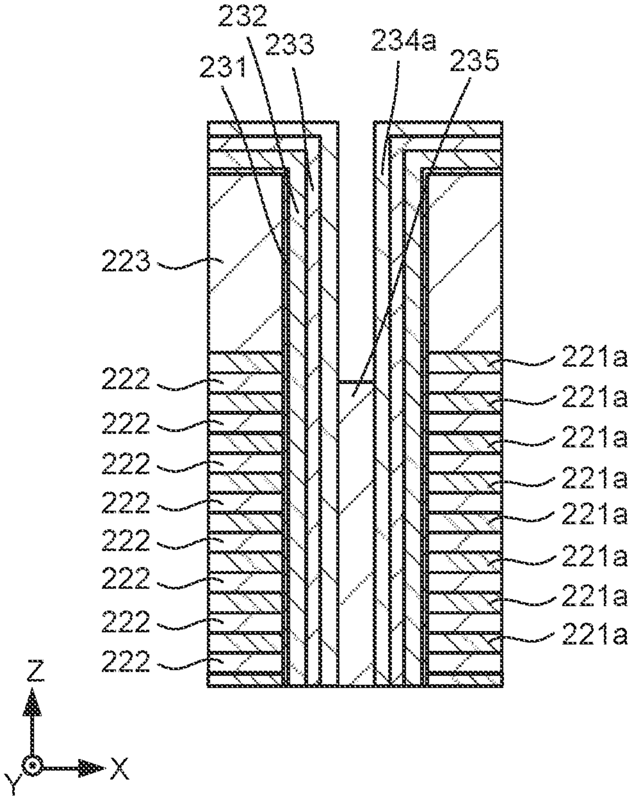
FIG. 13 is a cross-sectional schematic view for explaining an example of a core insulating layer etch-back step S1-6.

FIG. 13 is a cross-sectional schematic view for explaining an example of the core insulating layer etch-back step S1-6, and illustrates a part of the X-Z cross section of the memory cell. The core insulating layer etch-back step S1-6 includes partially removing the core insulating layer 235 along the Z-axis direction to make the top surface of the core insulating layer 235 lower than the top surface of the uppermost layer of the plurality of sacrificial layers 221*a* with respect to the surface of the semiconductor substrate 100 illustrated in FIG. 3. The core insulating layer 235 can be partially removed using the RIE or dry etching, for example.

[Second Semiconductor Part Formation Step S1-7]

Figure 14:
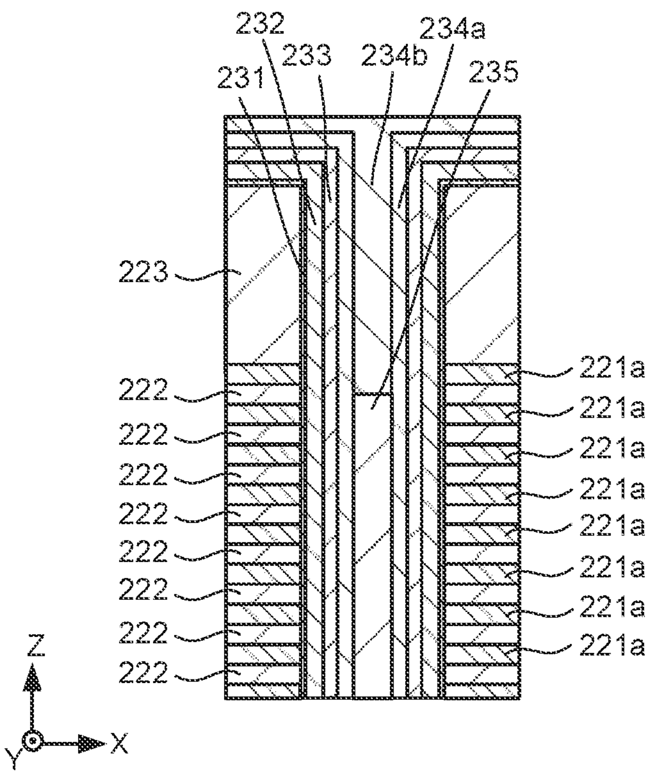
FIG. 14 is a cross-sectional schematic view for explaining an example of a second semiconductor part formation step S1-7.

FIG. 14 is a cross-sectional schematic view for explaining an example of the second semiconductor part formation step S1-7, and illustrates a part of the X-Z cross section of the memory cell. The second semiconductor part formation step S1-7 includes forming the semiconductor part 234*b* in contact with the surface of the semiconductor part 234*a* and the top surface of the core insulating layer 235. The semiconductor part 234*b* can be formed using the CVD or the ALD, for example.

[Second Semiconductor Part Etch-Back Step S1-8]

Figure 15:
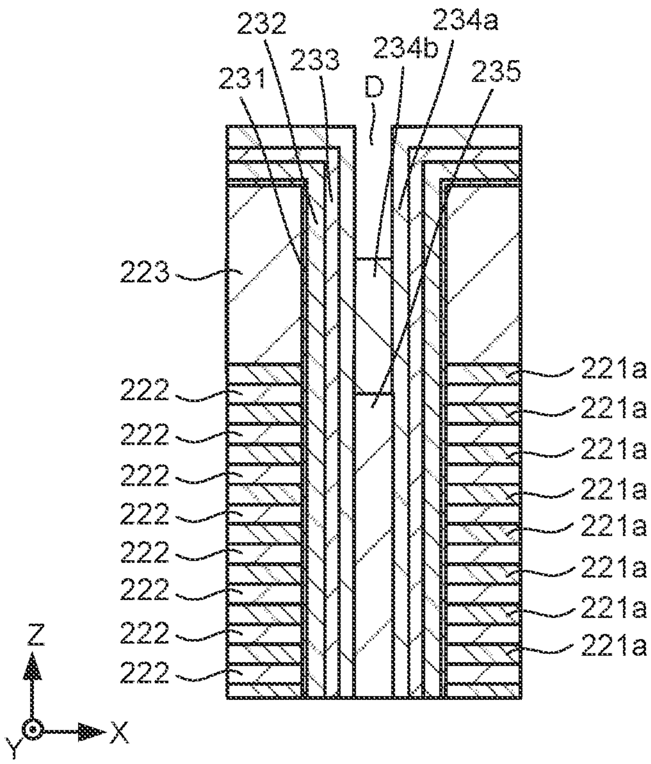
FIG. 15 is a cross-sectional schematic view for explaining an example of a second semiconductor part etch-back step S1-8.

FIG. 15 is a cross-sectional schematic view for explaining an example of the second semiconductor part etch-back step S1-8, and illustrates a part of the X-Z cross section of the memory cell. The second semiconductor part etch-back step S1-8 includes partially removing the semiconductor part 234*b* in the Z-axis direction in the opening MH to form a depression D. The semiconductor part 234*b* can be partially removed using the RIE or dry etching, for example.

[First Impurity Implantation Step S1-9]

Figure 16:
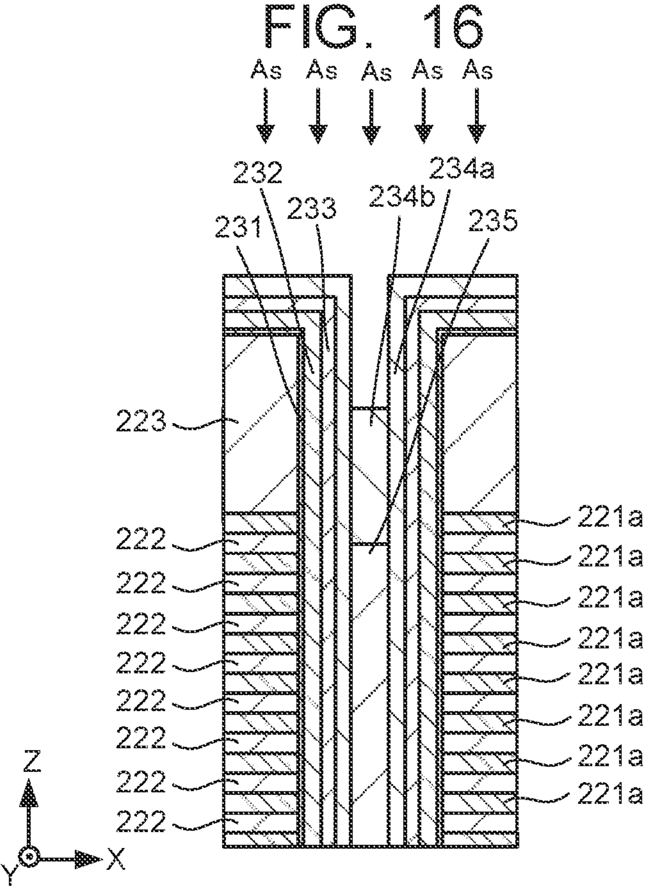
FIG. 16 is a cross-sectional schematic view for explaining an example of a first impurity implantation step S1-9.

FIG. 16 is a cross-sectional schematic view for explaining an example of the first impurity implantation step S1-9, and illustrates a part of the X-Z cross section of the memory cell. The first impurity implantation step S1-9 includes implanting an impurity such as arsenic or phosphorus into the semiconductor part 234*a* and the semiconductor part 234*b*. FIG. 16 illustrates the implantation of arsenic, and in the case of implanting phosphorus, phosphorus may be implanted, for example, before or after the implantation of arsenic. This forms the impurity semiconductor region containing arsenic and phosphorus indicating the concentration profile illustrated in FIG. 5.

[Cap Layer Formation Step S1-10]

Figure 17:
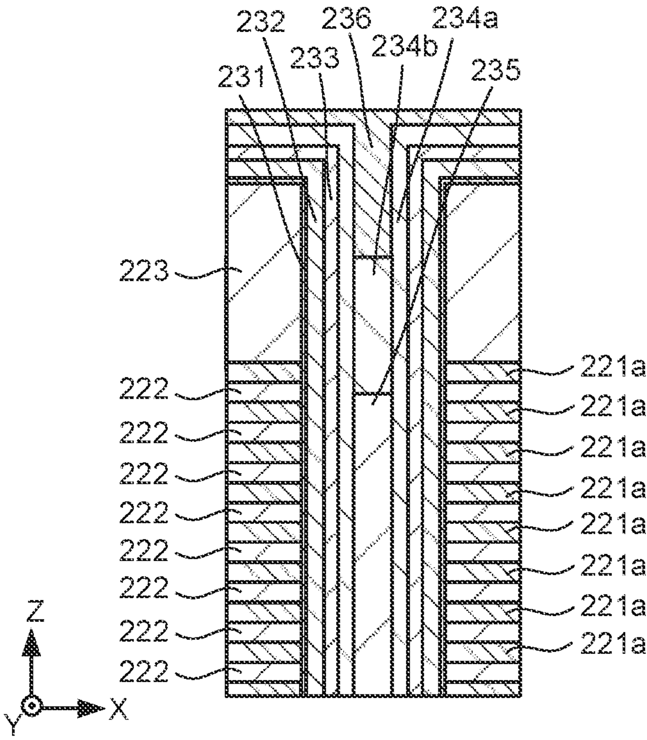
FIG. 17 is a cross-sectional schematic view for explaining an example of a cap layer formation step S1-10.

FIG. 17 is a cross-sectional schematic view for explaining an example of the cap layer formation step S1-10, and illustrates a part of the X-Z cross section of the memory cell. The cap layer formation step S1-10 includes forming the cap layer 236 filling the depression D. The cap layer 236 can be formed using the CVD or the ALD, for example.

[Etch-Back Step S1-11]

Figure 18:
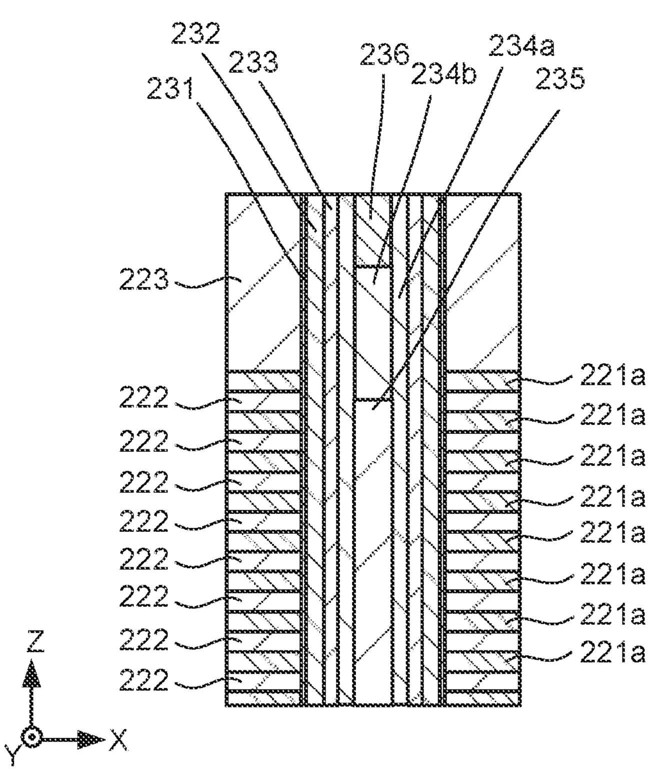
FIG. 18 is a cross-sectional schematic view for explaining an example of an etch-back step S1-11.

FIG. 18 is a cross-sectional schematic view for explaining an example of the etch-back step S1-11, and illustrates a part of the X-Z cross section of the memory cell. The etch-back step S1-11 includes partially removing the block insulating film 231, the charge storage film 232, the tunnel insulating film 233, the semiconductor part 234*a*, and the cap layer 236 along the Z-axis direction to expose the top surface of the insulating layer 223. The block insulating film 231, the charge storage film 232, the tunnel insulating film 233, the semiconductor part 234*a*, and the cap layer 236 can be partially removed using the RIE or dry etching, for example. In the case where the cap layer 236 is made of an insulating layer such as a silicon oxide layer, an impurity such as arsenic or phosphorus may be implanted into the cap layer 236 after the etch-back step S1-11.

[Second Impurity Implantation Step S1-12]

Figure 19:
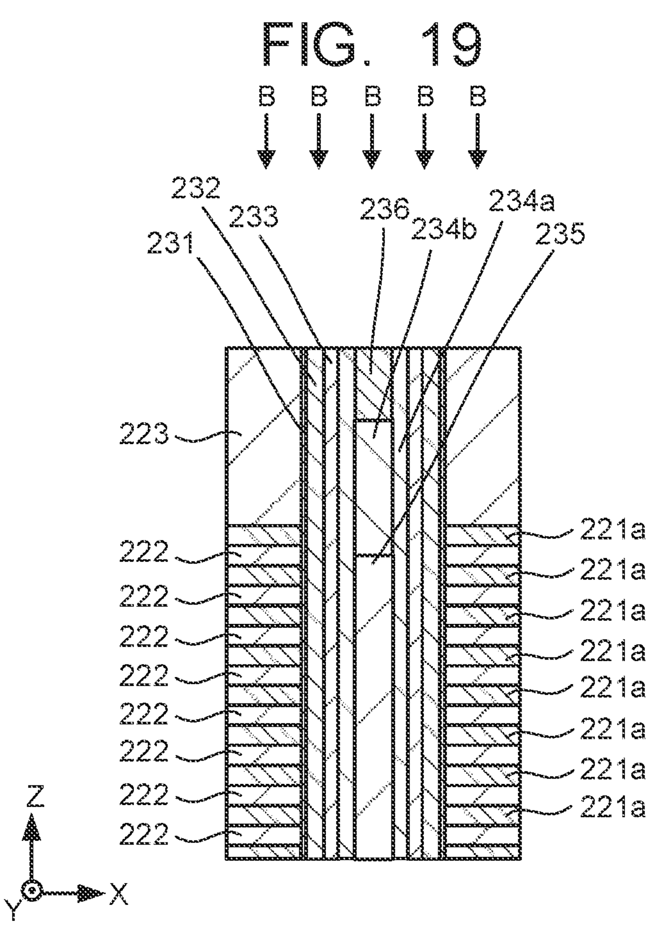
FIG. 19 is a cross-sectional schematic view for explaining an example of a second impurity implantation step S1-12.

FIG. 19 is a cross-sectional schematic view for explaining an example of the second impurity implantation step S1-12, and illustrates a part of the X-Z cross section of the memory cell. The second impurity implantation step S1-12 includes implanting an impurity into the semiconductor part 234*a*. FIG. 19 illustrates the implantation of boron. This forms the impurity semiconductor region of boron indicating the concentration profile illustrated in FIG. 5. Thereafter, a heat treatment is performed to crystallize, in the case of using amorphous silicon films for the semiconductor part 234*a*, the semiconductor part 234*b*, the cap layer 236, the amorphous silicon films to form polysilicon films, and to activate the doped impurity element. The second impurity implantation step S1-12 may be performed before the first impurity implantation step S1-9.

[Replacing Step S1-13]

Figure 20:
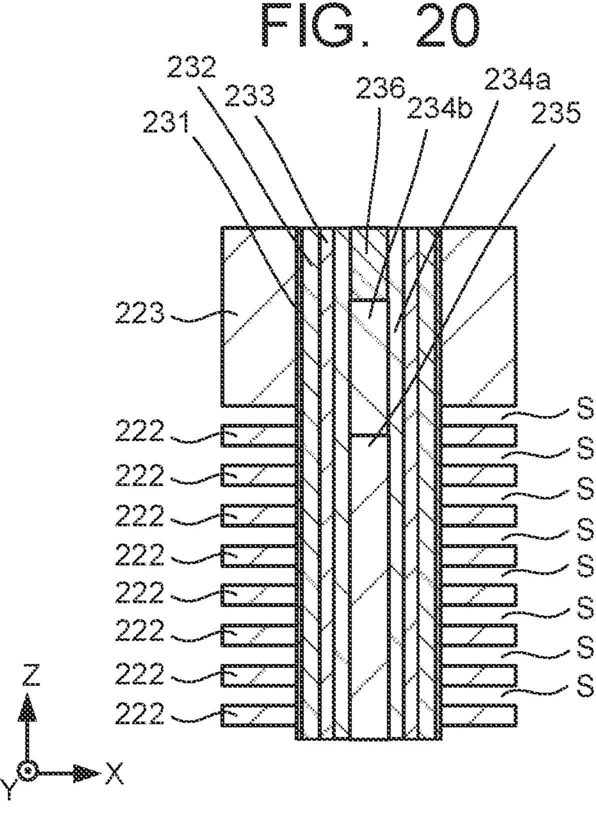
FIG. 20 is a cross-sectional schematic view for explaining an example of a replacing step S1-13.
Figure 21:
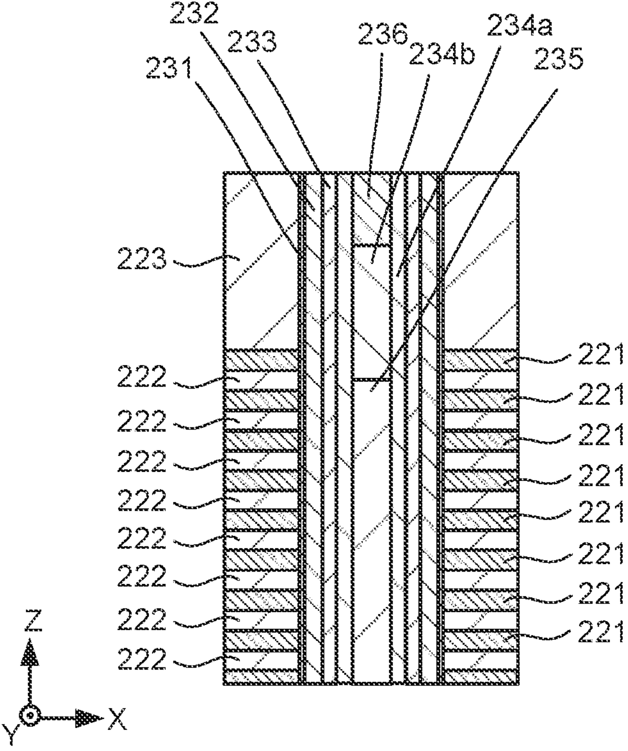
FIG. 21 is a cross-sectional schematic view for explaining the example of the replacing step S1-13.

FIG. 20 and FIG. 21 are cross-sectional schematic views for explaining an example of the replacing step S1-13, and illustrate a part of the X-Z cross section of the memory cell. The replacing step S1-13 includes removing the plurality of sacrificial layers 221*a* to form spaces S and forming the conductive layers 221 in the spaces S. The plurality of sacrificial layers 221*a* can be removed by dry etching or wet etching, for example. The conductive layers 221 can be formed using the CVD method or the ALD method, for example. With the above steps, the memory cell can be formed.

(First Modification Example of the Memory Cell)

Figure 22:
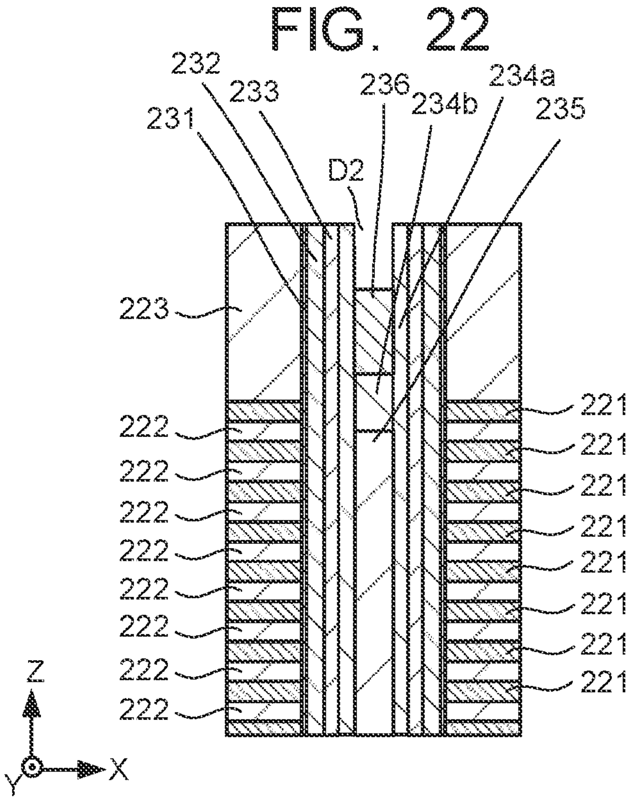
FIG. 22 is a cross-sectional schematic view for explaining a formation method example in a first modification example of the memory cell.
Figure 23:
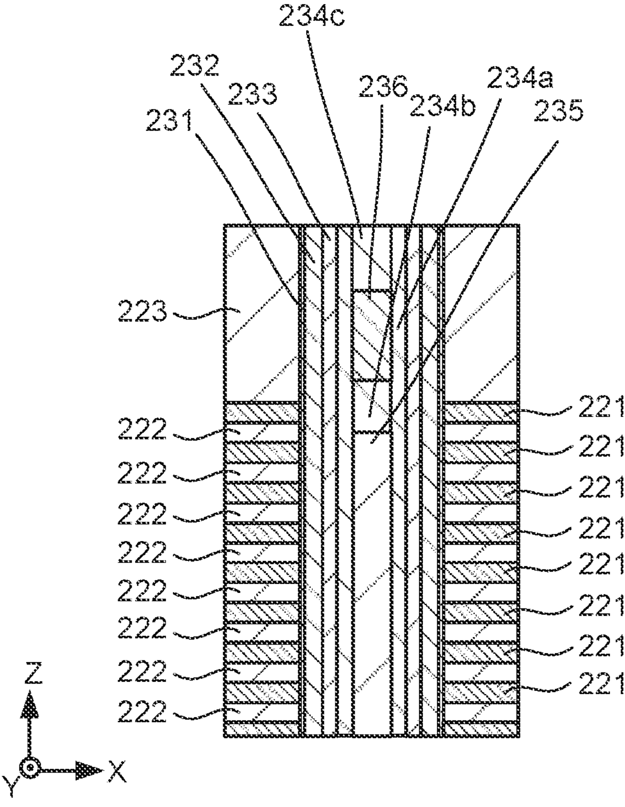
FIG. 23 is a cross-sectional schematic view for explaining the formation method example in the first modification example of the memory cell.

The first modification example of the memory cell will be explained with reference to FIG. 22 and FIG. 23. FIG. 22 and FIG. 23 are cross-sectional schematic views for explaining a method example of forming the memory cell in the first modification example of, and illustrates a part of the X-Z cross section of the memory cell. In the first modification example, an example in which the cap layer 236 illustrated in FIG. 3 is an insulating layer such as a silicon oxide layer or the like and a semiconductor part 234*c* is formed on the cap layer 236 will be explained. Explanation of the same portions as those of the method example of forming the memory cell explained with reference to FIG. 7 to FIG. 21 will be omitted here, but different portions from those of the above method example of forming the memory cell will be explained below.

In the first modification example, as illustrated in FIG. 22, the cap layer 236 is further partially removed along the Z-axis direction after the etch-back step S1-11 illustrated in FIG. 7. This forms a depression D2. The cap layer 236 can be partially removed using the RIE or dry etching, for example.

Next, as illustrated in FIG. 23, the semiconductor part 234*c* which is in contact with the semiconductor part 234*a* and fills the depression D2 is formed. The semiconductor part 234*c* contains, for example, polysilicon. The semiconductor part 234*c* may be formed by crystallizing an amorphous silicon film, for example by the above heat treatment. The semiconductor part 234*c* can be formed by forming a semiconductor film using the CVD or the ALD, for example, and then partially removing the semiconductor film along the Z-axis direction using the dry etching, for example. The semiconductor part 234*c* may be formed using a semiconductor material such as a silicon doped with an impurity such as phosphorus. Further, after the semiconductor part 234*c* is formed, an impurity such as arsenic or phosphorus may be implanted into the surface of the semiconductor part 234*c*. An interface between the semiconductor part 234*a* and the semiconductor part 234*c* and an interface between the semiconductor part 234*a* and the semiconductor part 234*b* are not always clearly observed.

Thereafter, the second impurity implantation step S1-12 and the replacing step S1-13 illustrated in FIG. 7 are performed in order, whereby the memory cell in the first modification example can be formed. The formation of the semiconductor part 234*c* can reduce a connection resistance between the cap layer 236 and the contact layer 252. Further, the heat treatment after the second impurity implantation step S1-12 can crystallize, in the case of using amorphous silicon films for the semiconductor part 234*a*, the cap layer 236, the semiconductor part 234*c*, and so on, the amorphous silicon films to form polysilicon films, and can activate the doped impurity element.

(Second Modification Example of the Memory Cell)

Figure 24:
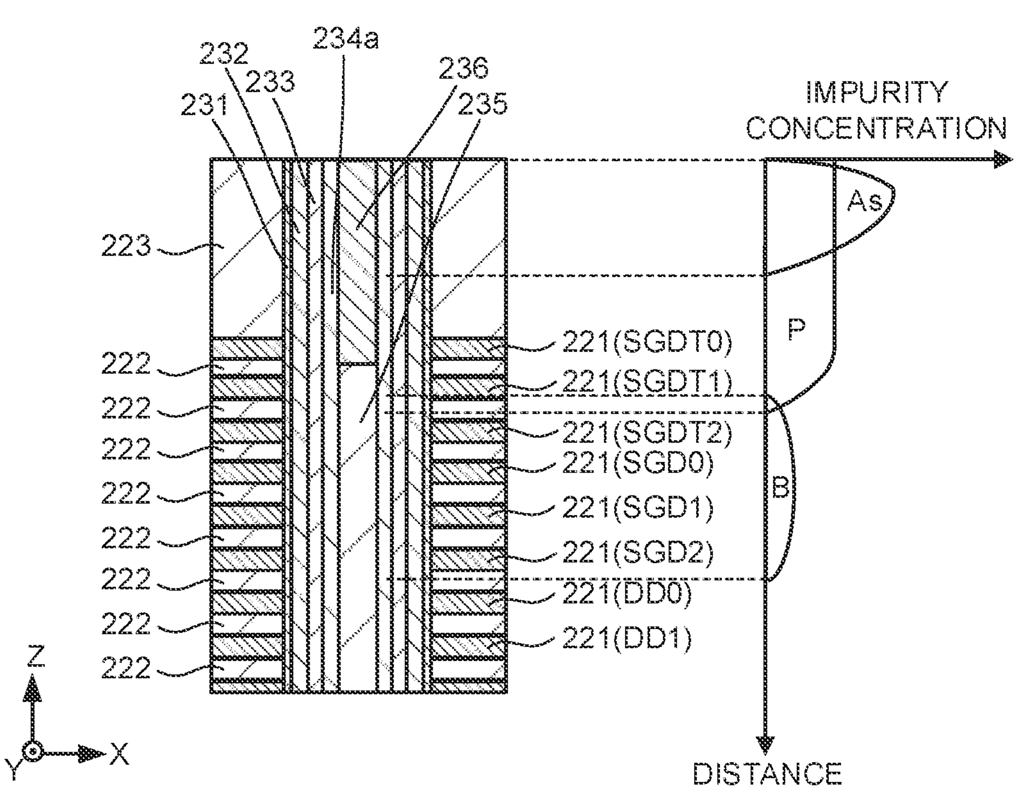
FIG. 24 is a cross-sectional schematic view for explaining a second modification example of the memory cell.

FIG. 24 is a cross-sectional schematic view for explaining the second modification example of the memory cell, and illustrates a part of the X-Z cross section of the memory cell. The memory cell in the second modification example is different in that the memory cell does not have the semiconductor part 234*b* and the bottom surface of the cap layer 236 is provided at a position lower than the height of the select gate line SGDT0 with respect to the semiconductor substrate 100, as compared with the memory cell illustrated in FIG. 3. The other portions have the same structures as those in the memory cell illustrated in FIG. 3, and explanation of them will be omitted here, and different portions will be explained below.

FIG. 24 further illustrates an example of a concentration profile of the impurity elements of the semiconductor part 234*a* (semiconductor layer 234). The concentration profile illustrated in FIG. 24 indicates that arsenic is implanted into a region of the semiconductor part 234*a* overlapping with the cap layer 236 and not overlapping with the select gate line SGDT. Further, the region has a concentration peak of arsenic.

Further, the concentration profile illustrated in FIG. 24 indicates that phosphorus is implanted into a region of the semiconductor part 234*a* overlapping with the select gate lines SGDT0, SGDT1. This indicates that the region of the semiconductor part 234*a* overlapping with the select gate lines SGDT0, SGDT1 has an impurity semiconductor region containing phosphorus. Phosphorus does not always have to be implanted. In the case where the cap layer 236 is composed of a semiconductor layer such as polysilicon containing doped phosphorus, an impurity semiconductor region containing phosphorus can be formed by diffusing the phosphorus contained in the semiconductor layer by a later-explained heat treatment.

Further, the concentration profile illustrated in FIG. 24 indicates that boron is implanted into a region of the semiconductor part 234*a* overlapping with the select gate lines SGDT2, SGD0, SGD1, SGD2. This indicates that the region of the semiconductor part 234*a* overlapping with the select gate lines SGDT2, SGD0, SGD1, SGD2 has an impurity semiconductor region containing boron. This can reduce the variation in threshold voltage. Boron does not always have to be implanted.

The second modification example includes that the top surface of the core insulating layer 235 is lower than the top surface of the select gate line SGDT0, this causes the impurity element to easily reach the region of the semiconductor part 234*a* overlapping with the select gate line SGDT0 to form the impurity semiconductor region. This can increase the GIDL current and thus provide a semiconductor memory device capable of an easy erase operation.

Figure 25:
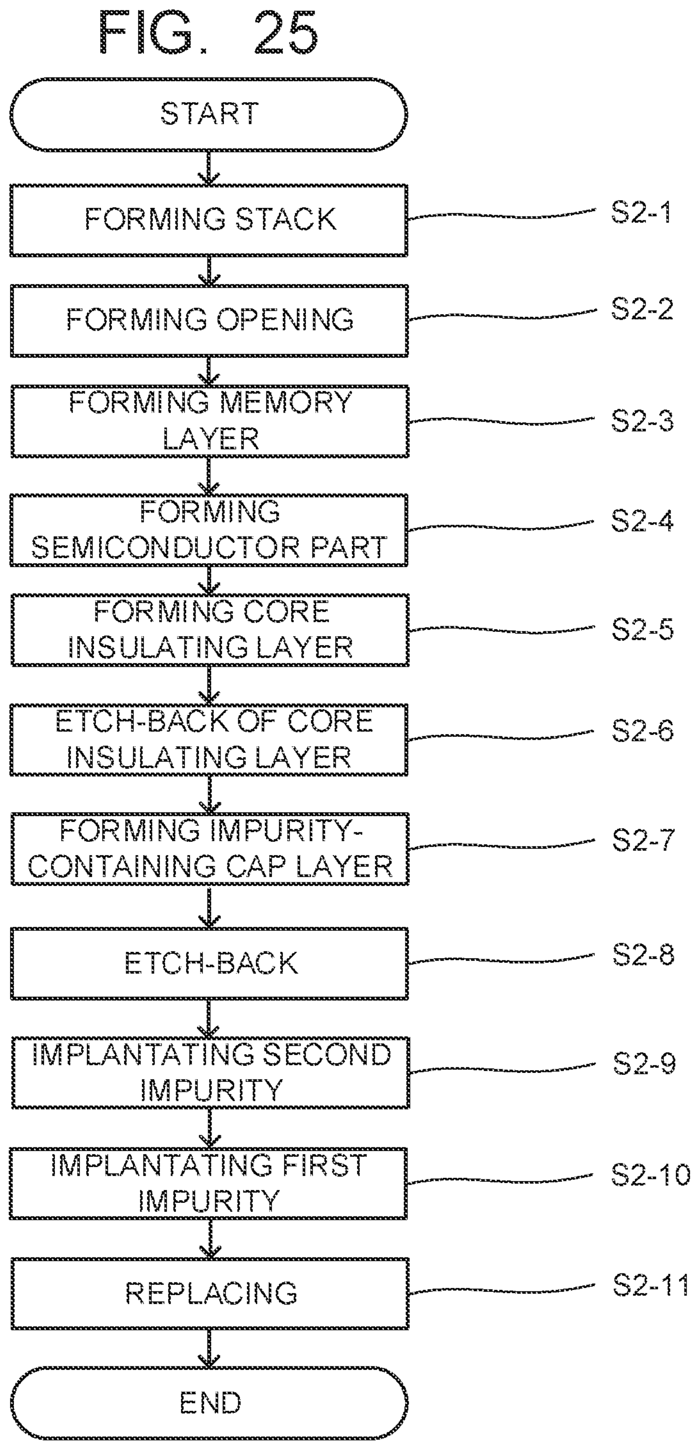
FIG. 25 is a flowchart for explaining the method example of forming the memory cell.

A method example of forming the memory cell in the second modification example will be explained. FIG. 25 is a flowchart for explaining the method example of forming the memory cell.

The method example of forming the memory cell in the second modification example includes, as illustrated in FIG. 25, a stack formation step S2-1, an opening formation step S2-2, a memory layer formation step S2-3, a semiconductor part formation step S2-4, a core insulating layer formation step S2-5, a core insulating layer etch-back step S2-6, an impurity-containing cap layer formation step S2-7, an etch-back step S2-8, a second impurity implantation step S2-9, a first impurity implantation step S2-10, and a replacing step S2-11. These steps are not limited to the order of steps illustrated in FIG. 25.

The stack formation step S2-1, the opening formation step S2-2, the memory layer formation step S2-3, the semiconductor part formation step S2-4, and the core insulating layer formation step S2-5 are the same as the stack formation step S1-1, the opening formation step S1-2, the memory layer formation step S1-3, the first semiconductor part formation step S1-4, and the core insulating layer formation step S1-5 illustrated in FIG. 7 respectively, and therefore explanation of them will be omitted here.

[Core Insulating Layer Etch-Back Step S2-6]

Figure 26:
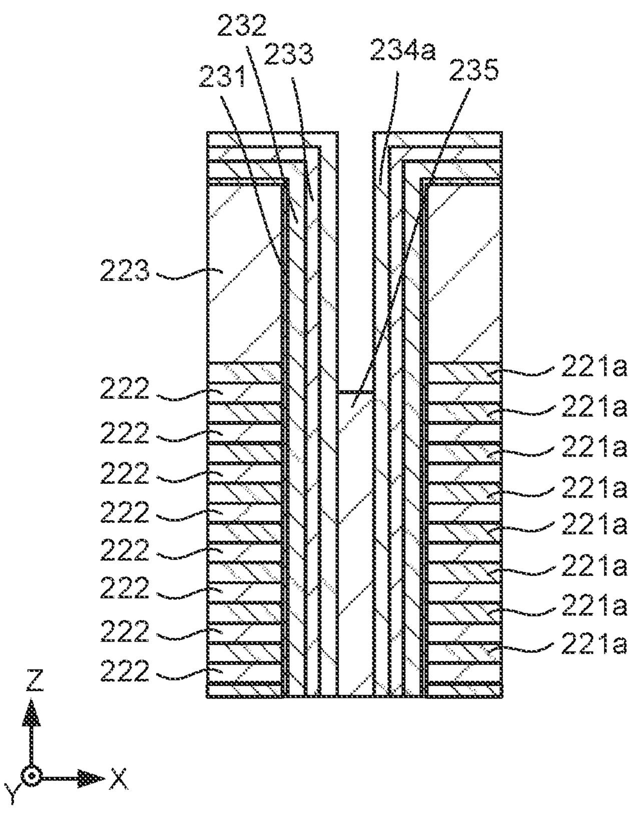
FIG. 26 is a cross-sectional schematic view for explaining an example of a core insulating layer etch-back step S2-6.

FIG. 26 is a cross-sectional schematic view for explaining an example of the core insulating layer etch-back step S2-6, and illustrates a part of the X-Z cross section of the memory cell. The core insulating layer etch-back step S2-6 includes partially removing the core insulating layer 235 along the Z-axis direction to make the top surface of the core insulating layer 235 lower than the top surface of the uppermost layer of the plurality of sacrificial layers 221*a* with respect to the surface of the semiconductor substrate 100 illustrated in FIG. 3. The core insulating layer 235 can be partially removed using the RIE or dry etching, for example.

[Impurity-Containing Cap Layer Formation Step S2-7]

Figure 27:
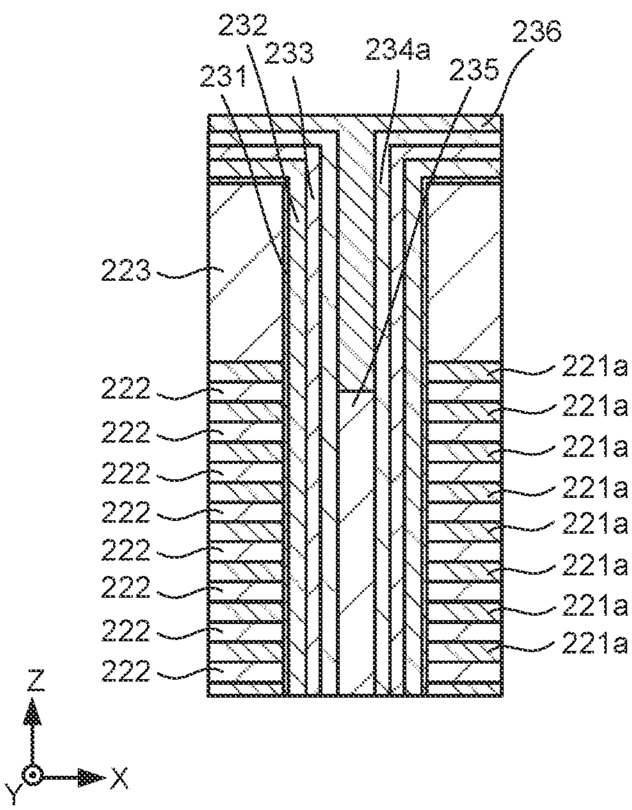
FIG. 27 is a cross-sectional schematic view for explaining an example of an impurity-containing cap layer formation step S2-7.

FIG. 27 is a cross-sectional schematic view for explaining an example of the impurity-containing cap layer formation step S2-7, and illustrates a part of the X-Z cross section of the memory cell. The impurity-containing cap layer formation step S2-7 includes forming the cap layer 236 in contact with the surface of the semiconductor part 234*a* and the top surface of the core insulating layer 235. The cap layer 236 is an amorphous silicon film doped with, for example, phosphorus. The cap layer 236 can be formed using the CVD or the ALD, for example.

[Etch-Back Step S2-8]

Figure 28:
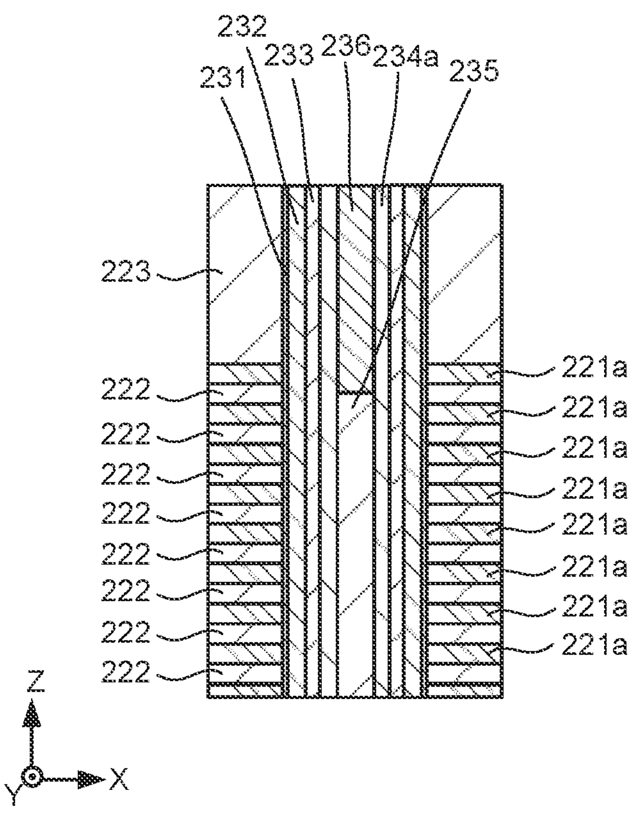
FIG. 28 is a cross-sectional schematic view for explaining an example of an etch-back step S2-8.

FIG. 28 is a cross-sectional schematic view for explaining an example of the etch-back step S2-8, and illustrates a part of the X-Z cross section of the memory cell. The etch-back step S2-8 includes partially removing the block insulating film 231, the charge storage film 232, the tunnel insulating film 233, the semiconductor part 234*a*, and the cap layer 236 along the Z-axis direction to expose the top surface of the insulating layer 223. The block insulating film 231, the charge storage film 232, the tunnel insulating film 233, the semiconductor part 234*a*, and the cap layer 236 can be partially removed using the RIE or dry etching, for example.

Next, the second impurity implantation step S2-9 is performed by implanting an impurity into the semiconductor part 234*a*. This forms the impurity semiconductor region containing boron indicating the concentration profile illustrated in FIG. 24. The second impurity implantation step S2-9 is the same as the second impurity implantation step S1-12, and therefore the explanation of the second impurity implantation step S1-12 can be used as appropriate.

[First Impurity Implantation Step S2-10]

Figure 29:
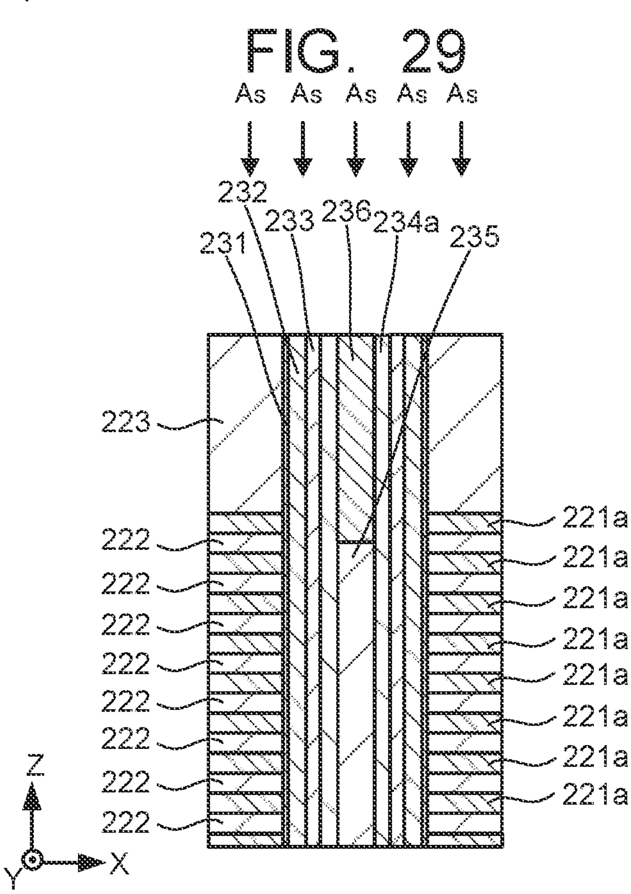
FIG. 29 is a cross-sectional schematic view for explaining an example of a first impurity implantation step S2-10.

FIG. 29 is a cross-sectional schematic view for explaining an example of the first impurity implantation step S2-10, and illustrates a part of the X-Z cross section of the memory cell. The first impurity implantation step S2-10 includes implanting an impurity such as arsenic or phosphorus into the semiconductor part 234*a*. FIG. 29 illustrates the implantation of arsenic, and in the case of implanting phosphorus, phosphorus may be implanted, for example, before or after the implantation of arsenic. This forms the impurity semiconductor region containing arsenic and phosphorus indicating the concentration profile illustrated in FIG. 24. Further, a heat treatment after the first impurity implantation step S2-10 can crystallize, in the case of using amorphous silicon films for the semiconductor part 234*a*, the cap layer 236, the semiconductor part 234*c*, and so on, the amorphous silicon films to form polysilicon films, and can activate the doped impurity element. The first impurity implantation step S2-10 may be performed before the second impurity implantation step S2-9.

Thereafter, the replacing step S2-11 is performed to form the conductive layers 221. The replacing step S2-11 is the same as the replacing step S1-13, and therefore the explanation of the replacing step S1-13 can be used as appropriate. The above steps can form a memory cell.

In the case where the cap layer 236 is made of an insulating layer such as a silicon oxide layer, the cap layer 236 is formed and then an impurity such as arsenic or phosphorus may be implanted into the surface of the cap layer 236. This can reduce a connection resistance between the cap layer 236 and the contact layer 252. Further, the heat treatment can crystallize, in the case of using amorphous silicon films for the semiconductor part 234*a*, the cap layer 236, and so on, the amorphous silicon films to form polysilicon films, and can activate the doped impurity element.

(Third Modification Example of the Memory Cell)

Figure 30:
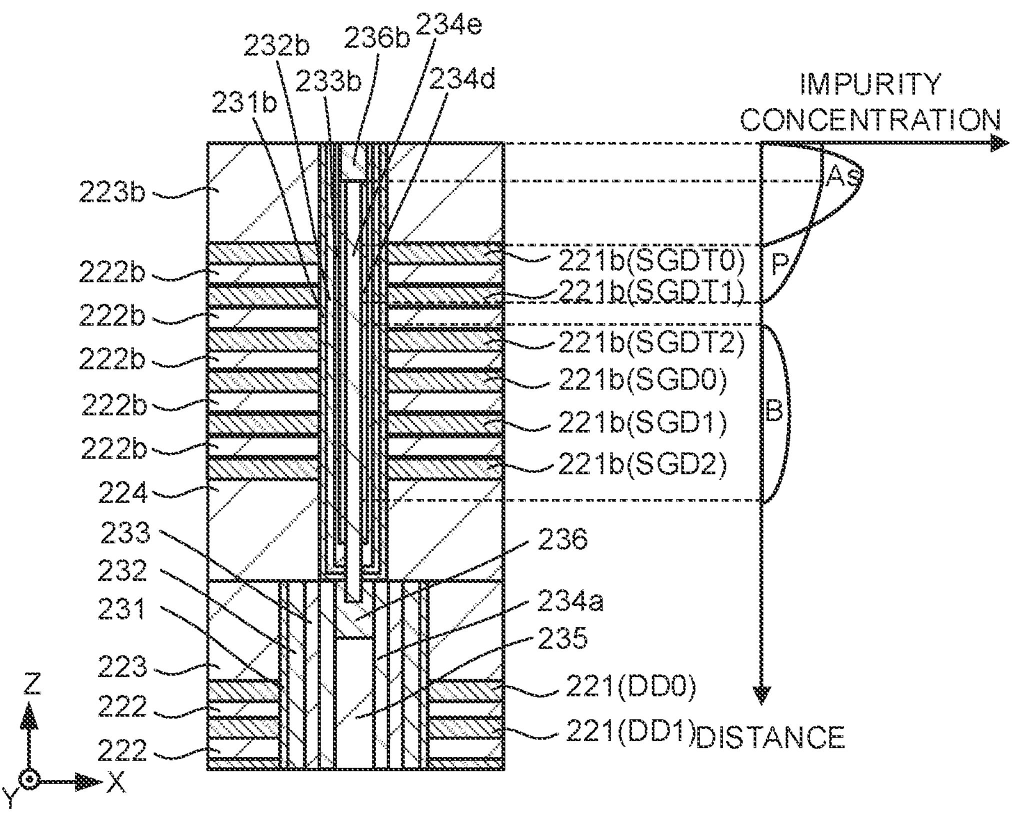
FIG. 30 is a cross-sectional schematic view for explaining a third modification example of the memory cell.

FIG. 30 is a cross-sectional schematic view for explaining the third modification example of the memory cell, and illustrates a part of the X-Z cross section of the memory cell. The memory cell in the third modification example is different in that the select gate lines SGD and the select gate lines SGDT are formed in a step different from that for other signal lines, as compared with the memory cell illustrated in FIG. 3.

FIG. 30 illustrates the conductive layers 221, the insulating layers 222, the insulating layer 223, the block insulating film 231, the charge storage film 232, the tunnel insulating film 233, the semiconductor part 234*a* (semiconductor layer 234), the core insulating layer 235, and the cap layer 236. These correspond to the insulating layer 223, the block insulating film 231, the charge storage film 232, the tunnel insulating film 233, the semiconductor part 234*a*, the core insulating layer 235, and the cap layer 236 illustrated in FIG. 3, respectively. Therefore, explanation of them will be omitted here. The cap layer 236 is a semiconductor layer containing silicon in FIG. 30.

FIG. 30 further illustrates conductive layers 221*b*, insulating layers 222*b*, an insulating layer 224, a block insulating film 231*b*, a charge storage film 232*b*, a tunnel insulating film 233*b*, a semiconductor layer 234*d*, a semiconductor part 234*e*, an insulating layer 223*b*, and a cap layer 236*b*.

The conductive layer 221*b* and the insulating layer 222*b* are alternately stacked to constitute a stack. A plurality of conductive layers 221*b* constitute select gate lines SGD0 to SGD2 and select gate lines SGDT0 to SGDT2, respectively. The conductive layers 221*b* contain a metal material such as tungsten. The insulating layers 222*b* contain, for example, silicon oxide.

The insulating layer 224 is provided on the insulating layer 223. The insulating layer 224 contains, for example, TEOS.

The block insulating film 231*b*, the charge storage film 232*b*, and the tunnel insulating film 233*b* are provided between the semiconductor layer 234*d* and the stack of the conductive layers 221*b* and the insulating layers 222*b*. The block insulating film 231*b*, the charge storage film 232*b*, and the tunnel insulating film 233*b* constitute a memory layer, and overlap with the conductive layers 221*b* including the select gate lines SGD and select gate lines SGDT. For the other explanation, the explanation of the block insulating film 231, the charge storage film 232, and the tunnel insulating film 233 can be used as appropriate.

The semiconductor part 234*d* is extended along the Z-axis direction. The semiconductor part 234*d* overlaps with the conductive layers 221*b* including the select gate lines SGD and select gate lines SGDT. The semiconductor part 234*d* contains, for example, polysilicon. The semiconductor part 234*d* may be formed, for example, by crystallizing an amorphous silicon film by a heat treatment. For the other explanation, the explanation of the semiconductor part 234*a* can be used as appropriate.

The semiconductor part 234*e* is extended along the Z-axis, and is in contact with the semiconductor part 234*d* and in contact with the top surface of the cap layer 236. A part of the semiconductor part 234*e* may be embedded in the cap layer 236. The semiconductor part 234*e* contains, for example, polysilicon. The semiconductor part 234*e* may be formed, for example, by crystallizing an amorphous silicon film by a heat treatment. For the other explanation, the explanation of the semiconductor part 234*b* can be used as appropriate.

The insulating layer 223*b* is provided on the stack including the conductive layers 221*b* and the insulating layers 222*b*. For the other explanation of the insulating layer 223*b*, the explanation of the insulating layer 223 can be used as appropriate.

The cap layer 236*b* is provided on the semiconductor part 234*e* and is in contact with the semiconductor part 234*d*. The cap layer 236*b* is composed of a semiconductor layer such as polysilicon containing doped phosphorus, for example. This can reduce a connection resistance between the cap layer 236*b* and the contact layer 252.

FIG. 30 further illustrates an example of a concentration profile of the impurity elements of the semiconductor part 234*d*. The concentration profile illustrated in FIG. 30 indicates that arsenic is implanted into a region of the semiconductor part 234*d* overlapping with the select gate line SGDT0.

Further, the concentration profile illustrated in FIG. 30 indicates that phosphorus is diffused in a region of the semiconductor part 234*d* overlapping with the select gate lines SGDT0, SGDT1. This indicates that the region of the semiconductor part 234*d* overlapping with the select gate lines SGDT0, SGDT1 has an impurity semiconductor region containing phosphorus. In the case where the cap layer 236*b* is made of a semiconductor layer such as polysilicon containing doped phosphorus, an impurity semiconductor region containing phosphorus can be formed by diffusing the phosphorus contained in the semiconductor layer by a later-explained heat treatment. In this case, the concentration of phosphorus gradually decreases from regions of the semiconductor part 234*d* and the semiconductor part 234*e* which are adjacent to the cap layer 236*b* toward the regions of the semiconductor part 234*d* and the semiconductor part 234*e* which overlap with the select gate lines SGDT0, SGDT1 as illustrated in FIG. 30.

Further, the concentration profile illustrated in FIG. 30 indicates that boron is implanted into a region of the semiconductor part 234*d* overlapping with the select gate lines SGDT2, SGD0, SGD1, SGD2. This indicates that the region of the semiconductor part 234*d* overlapping with the select gate lines SGDT2, SGD0, SGD1, SGD2 has an impurity semiconductor region containing boron. This can reduce the variation in threshold voltage. Boron does not always have to be implanted.

The third modification example includes that the select gate lines SGD and the select gate lines SGDT are formed in a step different from that for other signal lines, and formation parts of the select gate lines SGD and the select gate lines SGDT include a semiconductor layer provided in place of the core insulating layer. This can increase the current density of the select transistor ST1*a* and the select transistor ST1*b*.

Figure 31:
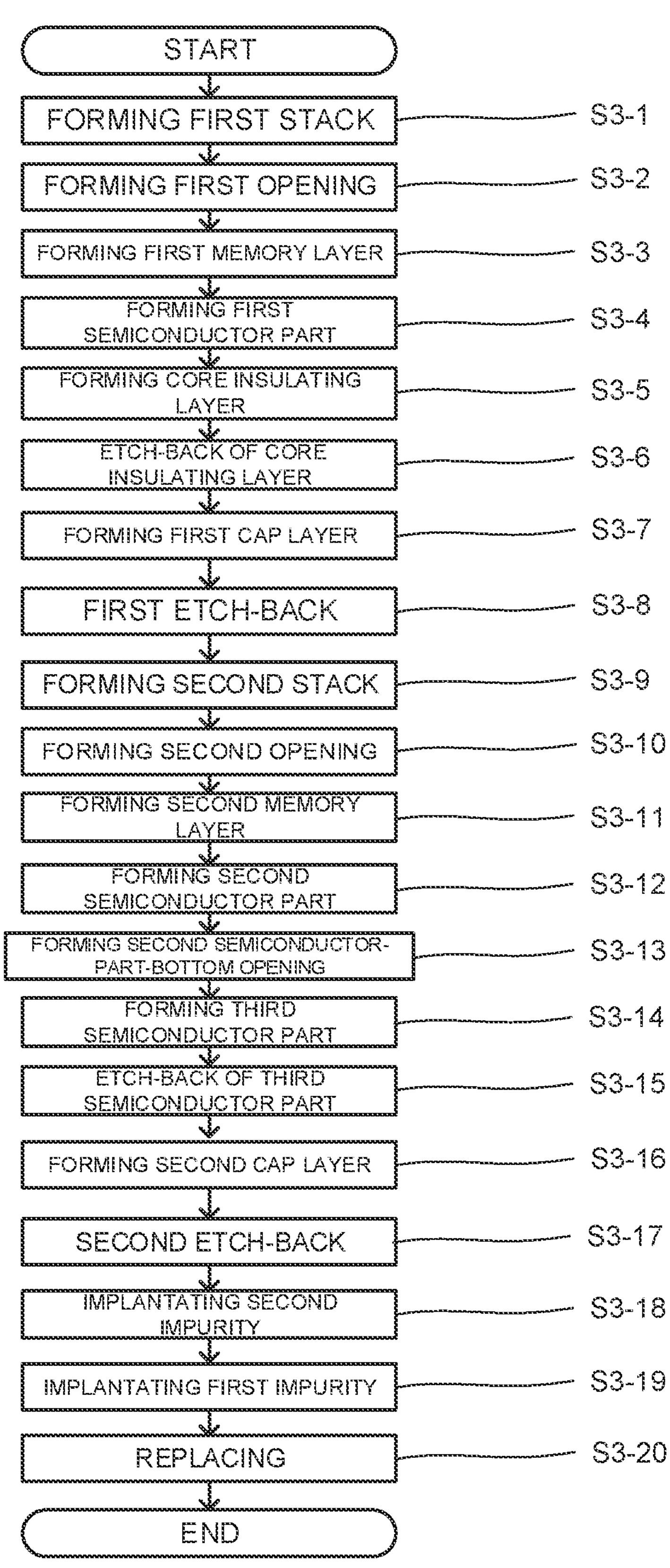
FIG. 31 is a flowchart for explaining a method example of forming the memory cell.

Next, a method example of forming the memory cell in the third modification example will be explained. FIG. 31 is a flowchart for explaining the method example of forming the memory cell.

The method example of forming the memory cell in the third modification example includes, as illustrated in FIG. 31, a first stack formation step S3-1, a first opening formation step S3-2, a first memory layer formation step S3-3, a first semiconductor part formation step S3-4, a core insulating layer formation step S3-5, a core insulating layer etch-back step S3-6, a first cap layer formation step S3-7, a first etch-back step S3-8, a second stack formation step S3-9, a second opening formation step S3-10, a second memory layer formation step S3-11, a second semiconductor part formation step S3-12, a second semiconductor-part-bottom opening formation step S3-13, a third semiconductor part formation step S3-14, a third semiconductor-part etch-back step S3-15, a second cap layer formation step S3-16, a second etch-back step S3-17, a second impurity implantation step S3-18, a first impurity implantation step S3-19, and a replacing step S3-20. These steps are not limited to the order of steps illustrated in FIG. 31.

Figure 32:
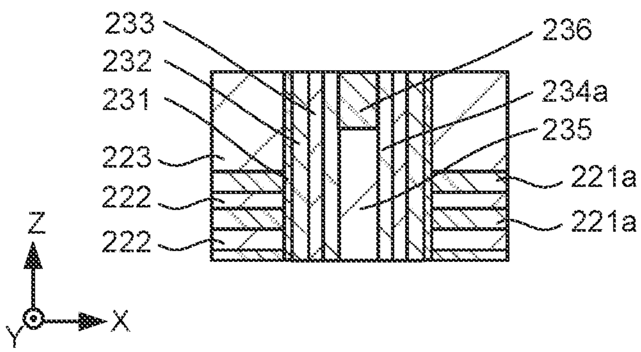
FIG. 32 is a cross-sectional schematic view for explaining an example of a first etch-back step S3-8.

First, the first stack formation step S3-1, the first opening formation step S3-2, the first memory layer formation step S3-3, the first semiconductor part formation step S3-4, the core insulating layer formation step S3-5, the core insulating layer etch-back step S3-6, the first cap layer formation step S3-7, and the first etch-back step S3-8 are performed in order. FIG. 32 is a cross-sectional schematic view for explaining an example of the first etch-back step S3-8, and illustrates a part of the X-Z cross section of the memory cell. These steps are the same as the stack formation step S1-1, the opening formation step S1-2, the memory layer formation step S1-3, the first semiconductor part formation step S1-4, the core insulating layer formation step S1-5, the core insulating layer etch-back step S1-6, the cap layer formation step S1-10, and the etch-back step S1-11 illustrated in FIG. 7 respectively except that the sacrificial layers 221*a* for forming the select gate lines SGD and the select gate lines SGDT are not formed, and therefore explanation of them will be omitted here.

[Second Stack Formation Step S3-9]

Figure 33:
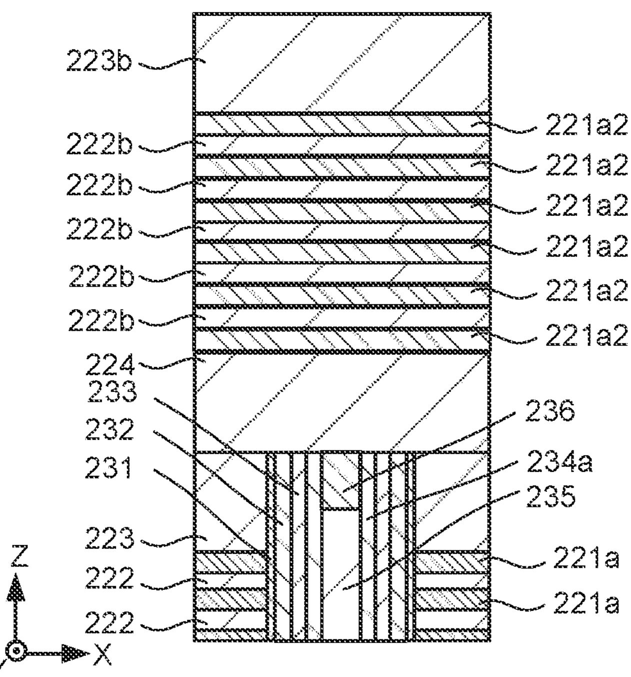
FIG. 33 is a cross-sectional schematic view for explaining an example of a second stack formation step S3-9.

FIG. 33 is a cross-sectional schematic view for explaining an example of the second stack formation step S3-9, and illustrates a part of the X-Z cross section of the memory cell. The second stack formation step S3-9 includes alternately stacking a sacrificial layer 221*a*2 and the insulating layer 222*b* as illustrated in FIG. 33 to form a second stack having a plurality of sacrificial layers 221*a*2 and a plurality of insulating layers 222*b*, and forms the insulating layer 223*b* on the second stack. The sacrificial layer 221*a*2 and the insulating layer 222*b* can be formed using the CVD, for example.

The second stack is provided above the peripheral circuits provided on the surface of the semiconductor substrate 100 illustrated in FIG. 3 and on the insulating layer 224 formed on the insulating layer 223. The sacrificial layers 221*a*2 are provided for forming the conductive layers 221*b*. The sacrificial layers 221*a*2 extend, for example, in the X-axis direction together with the insulating layers 222*b*. The sacrificial layers 221*a*2 contain, for example, silicon nitride.

[Second Opening Formation Step S3-10]

Figure 34:
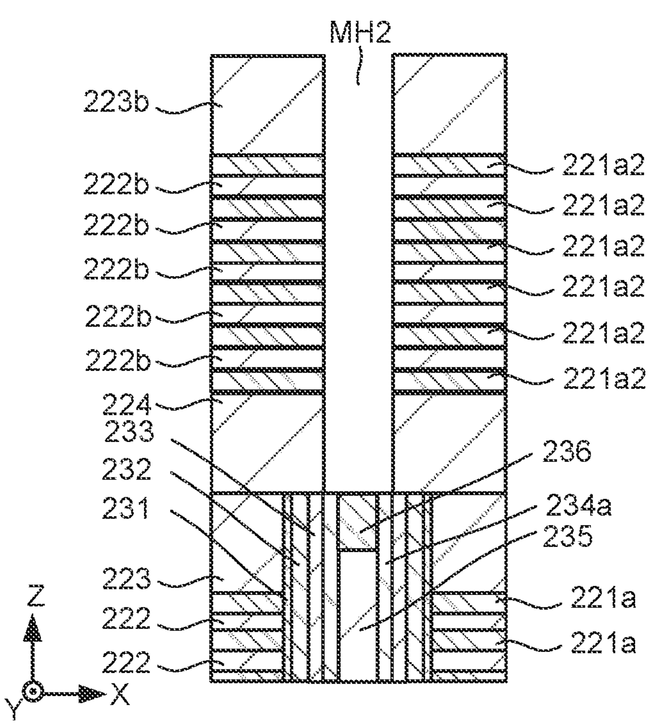
FIG. 34 is a cross-sectional schematic view for explaining an example of a second opening formation step S3-10.

FIG. 34 is a cross-sectional schematic view for explaining an example of the second opening formation step S3-10, and illustrates a part of the X-Z cross section of the memory cell. The second opening formation step S3-10 includes partially removing the second stack to form an opening MH2 extending in the Z-axis direction. The second stack can be partially removed using, for example, a photolithography technique and RIE.

[Second Memory Layer Formation Step S3-11]

Figure 35:
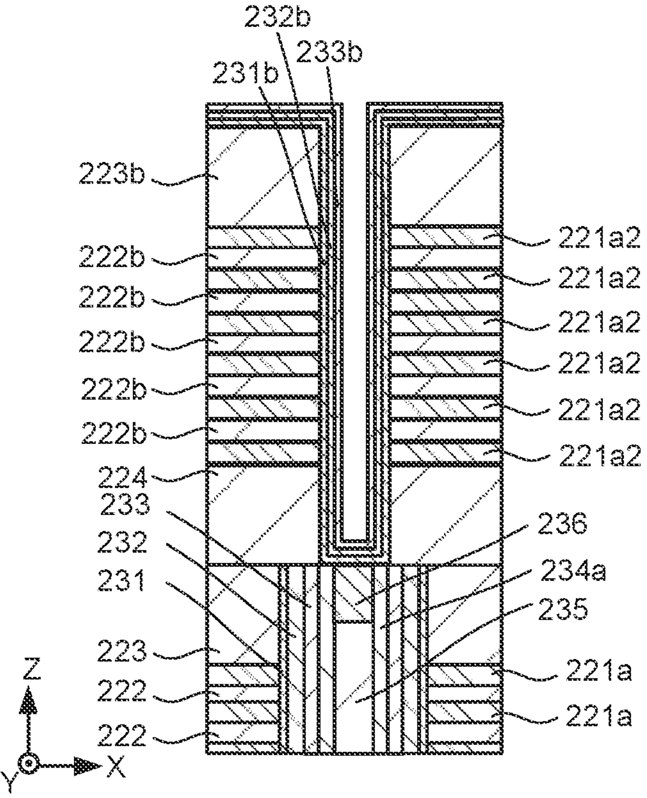
FIG. 35 is a cross-sectional schematic view for explaining an example of a second memory layer formation step S3-11.

FIG. 35 is a cross-sectional schematic view for explaining an example of the second memory layer formation step S3-11, and illustrates a part of the X-Z cross section of the memory cell. The second memory layer formation step S3-11 includes forming the block insulating film 231*b*, the charge storage film 232*b*, and the tunnel insulating film 233*b* in order on an inner wall surface of the opening MH to form a second memory layer. These films can be formed using the CVD or sputtering for example.

[Second Semiconductor Part Formation Step S3-12]

Figures 36, 37:
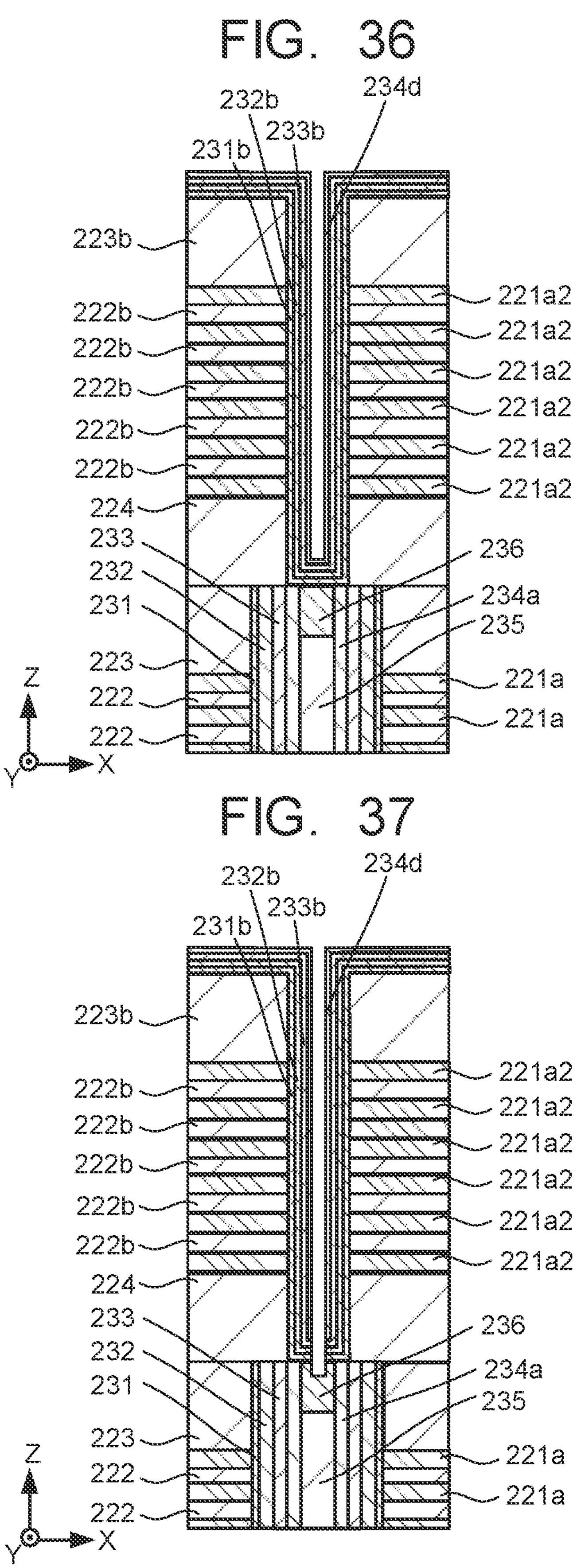
FIG. 36 is a cross-sectional schematic view for explaining an example of a second semiconductor part formation step S3-12.
FIG. 37 is a cross-sectional schematic view for explaining an example of a second semiconductor-part-bottom opening formation step S3-13.

FIG. 36 is a cross-sectional schematic view for explaining an example of the second semiconductor part formation step S3-12, and illustrates a part of the X-Z cross section of the memory cell. The second semiconductor part formation step S3-12 includes forming the semiconductor part 234*d* on the surface of the second memory layer. The semiconductor part 234*d* can be formed using the CVD or the ALD, for example.

[Second Semiconductor-Part-Bottom Opening Formation Step S3-13]

FIG. 37 is a cross-sectional schematic view for explaining an example of the second semiconductor-part-bottom opening formation step S3-13, and illustrates a part of the X-Z cross section of the memory cell. The second semiconductor-part-bottom opening formation step S3-13 includes partially removing the block insulating film 231*b*, the charge storage film 232*b*, the tunnel insulating film 233*b*, and the semiconductor part 234*d* in the Z-axis direction to expose a part of the surface of the cap layer 236 in the opening MH2. The block insulating film 231*b*, the charge storage film 232*b*, the tunnel insulating film 233*b*, and the semiconductor part 234*d* can be partially removed using the RIE or dry etching, for example.

[Third Semiconductor Part Formation Step S3-14]

Figure 38:
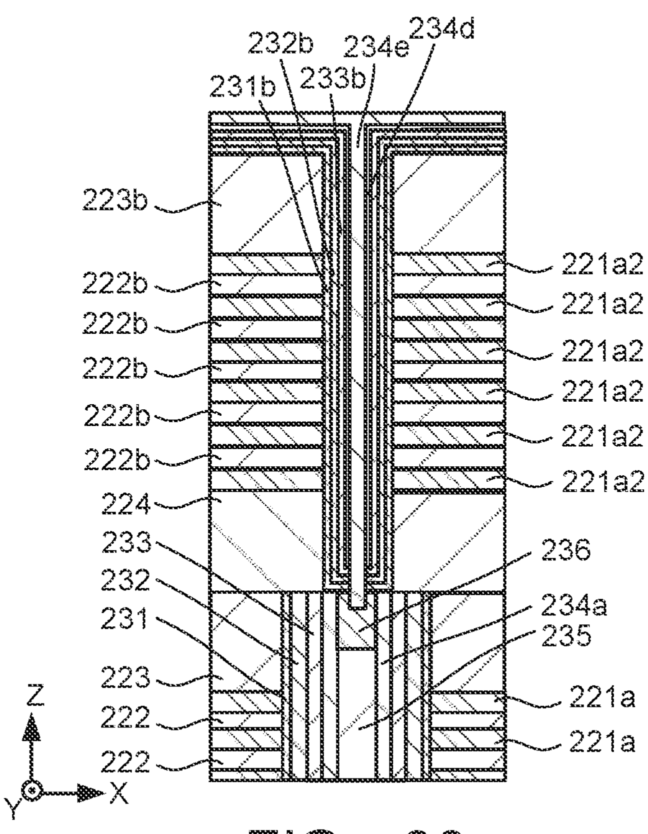
FIG. 38 is a cross-sectional schematic view for explaining an example of a third semiconductor part formation step S3-14.

FIG. 38 is a cross-sectional schematic view for explaining an example of the third semiconductor part formation step S3-14, and illustrates a part of the X-Z cross section of the memory cell. The third semiconductor part formation step S3-14 includes forming the semiconductor part 234*e* in contact with the semiconductor part 234*d* and filling the opening MH2. The semiconductor part 234*e* can be formed using the CVD or the ALD, for example.

[Third Semiconductor-Part Etch-Back Step S3-15]

Figure 39:
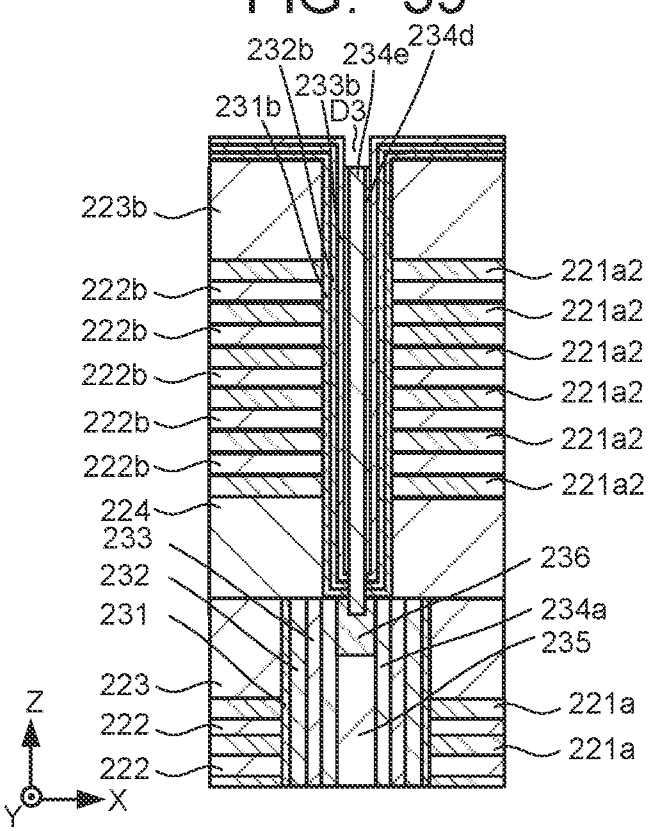
FIG. 39 is a cross-sectional schematic view for explaining an example of a third semiconductor-part etch-back step S3-15.

FIG. 39 is a cross-sectional schematic view for explaining an example of the third semiconductor-part etch-back step S3-15, and illustrates a part of the X-Z cross section of the memory cell. The third semiconductor-part etch-back step S3-15 includes partially removing the semiconductor part 234*d* and the semiconductor part 234*e* in the Z-axis direction to form a depression D3. The semiconductor part 234*e* can be partially removed using the RIE or dry etching, for example.

[Second Cap Layer Formation Step S3-16]

Figure 40:
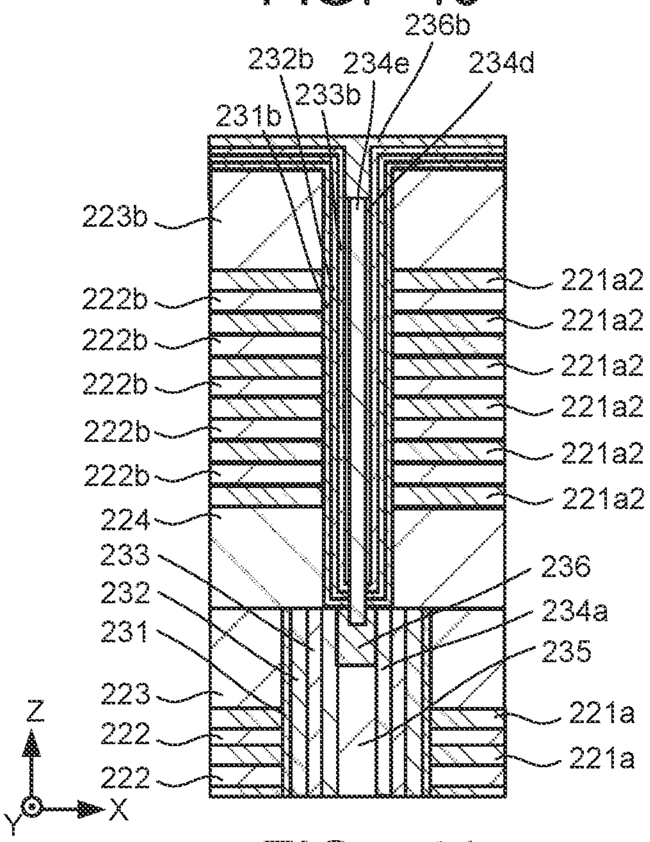
FIG. 40 is a cross-sectional schematic view for explaining an example of a first impurity implantation step S3-19.

FIG. 40 is a cross-sectional schematic view for explaining an example of the second cap layer formation step S3-16, and illustrates a part of the X-Z cross section of the memory cell. The second cap layer formation step S3-16 includes forming the cap layer 236*b* filling the depression D3. The cap layer 236*b* is an amorphous silicon film doped with, for example, phosphorus. The cap layer 236*b* can be formed using the CVD or the ALD, for example.

[Second Etch-Back Step S3-17]

Figure 41:
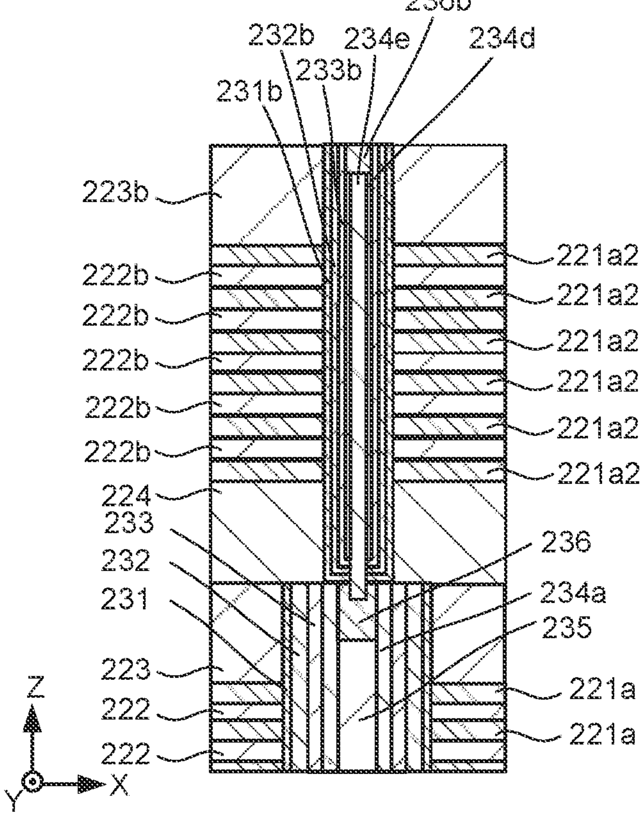
FIG. 41 is a cross-sectional schematic view for explaining an example of a second cap layer formation step S3-16.

FIG. 41 is a cross-sectional schematic view for explaining an example of the second etch-back step S3-17, and illustrates a part of the X-Z cross section of the memory cell. The second etch-back step S3-17 includes partially removing the block insulating film 231*b*, the charge storage film 232*b*, the tunnel insulating film 233*b*, the semiconductor part 234*d*, the semiconductor part 234*e*, and the cap layer 236*b* along the Z-axis direction to expose the top surface of the insulating layer 223*b*. The block insulating film 231*b*, the charge storage film 232*b*, the tunnel insulating film 233*b*, the semiconductor part 234*d*, the semiconductor part 234*e*, and the cap layer 236*b* can be partially removed using dry etching, for example.

Next, the second impurity implantation step S3-18 is performed to implant an impurity into the semiconductor part 234*d*. This forms the impurity semiconductor region containing boron indicating the concentration profile illustrated in FIG. 30. The other explanation of the second impurity implantation step S3-18 is the same as that of the second impurity implantation step S1-12, and therefore the explanation of the second impurity implantation step S1-12 can be used as appropriate.

[First Impurity Implantation Step S3-19]

Figure 42:
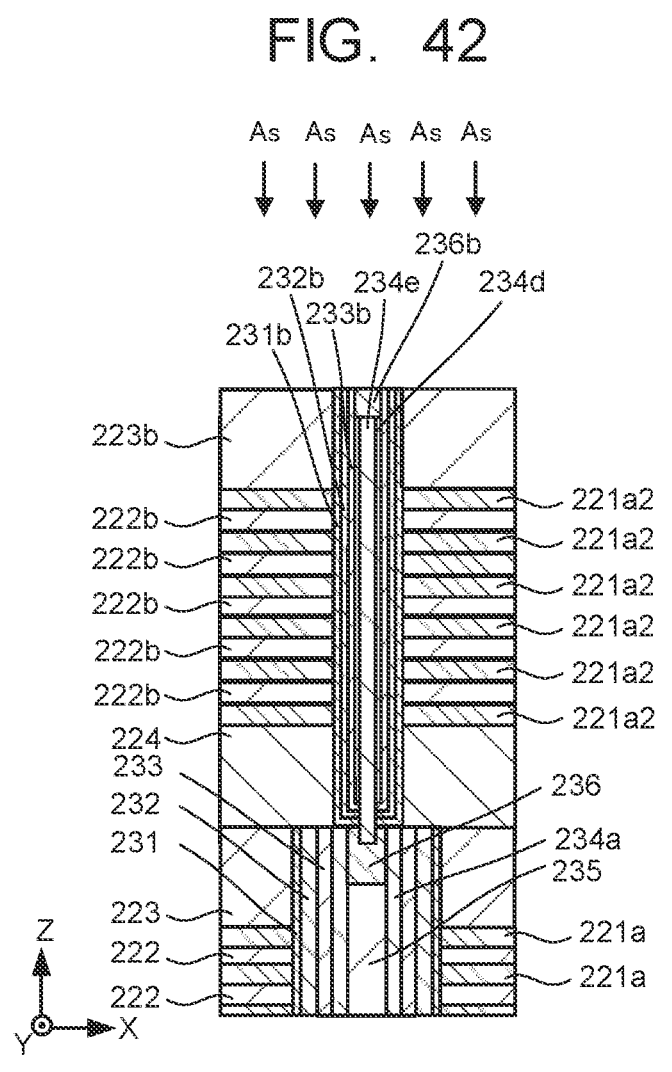

FIG. 42 is a cross-sectional schematic view for explaining an example of the first impurity implantation step S3-19, and illustrates a part of the X-Z cross section of the memory cell. The first impurity implantation step S3-19 includes implanting an impurity such as arsenic or phosphorus into the semiconductor part 234*d* and the semiconductor part 234*e*. FIG. 42 illustrates the implantation of arsenic, and in the case of implanting phosphorus, phosphorus may be implanted, for example, before or after the implantation of arsenic. This forms the impurity semiconductor region containing arsenic or phosphorus indicating the concentration profile illustrated in FIG. 30. The semiconductor part 234*d* and the semiconductor part 234*e* may be formed of a silicon film doped with an impurity such as phosphorus. Further, a heat treatment after the first impurity implantation step S3-19 can crystallize, in the case of using amorphous silicon films for the semiconductor part 234*a*, the cap layer 236, the semiconductor part 234*d*, the semiconductor part 234*e*, the cap layer 236*b* and so on, the amorphous silicon films to form polysilicon films, and can activate the doped impurity element. Further, in the case where the cap layer 236*b* is made of a semiconductor layer such as polysilicon containing doped phosphorus, an impurity semiconductor region containing phosphorus can be formed by diffusing the phosphorus contained in the semiconductor layer by the heat treatment. The first impurity implantation step S3-19 may be performed before the second impurity implantation step S3-18.

Thereafter, the replacing step S3-20 is performed to form the conductive layers 221*b*. The other explanation of the replacing step S3-20 is the same as that of the replacing step S1-13, and therefore the explanation of the replacing step S1-13 can be used as appropriate. The above steps can form a memory cell.

After the cap layer 236*b* is formed, an impurity such as arsenic or phosphorus may be implanted into the surface of the cap layer 236*b*. This can reduce a connection resistance between the cap layer 236*b* and the contact layer 252.

While certain embodiments of the present invention have been described above, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:

a peripheral circuit provided on a surface of a semiconductor substrate; and a memory cell array provided above the peripheral circuit, wherein the memory cell array includes:

a stack having conductive layers and insulating layers, each conductive layer and each insulating layer being alternately stacked and extending in a first direction, the conductive layers including a first select gate line connected to a gate of a first select transistor, a word line provided above the first select gate line and connected to a gate of a memory transistor, and a second select gate line provided above the word line and connected to a gate of a second select transistor, a core insulating layer extending in a second direction intersecting the first direction, the core insulating layer having a top surface lower than a top surface of the second select gate line with respect to the surface of the semiconductor substrate;

a semiconductor layer extending in the second direction, the semiconductor layer having a first semiconductor part and a second semiconductor part, the first semiconductor part having channel formation regions of the memory transistor and the first and second select transistors, and the second semiconductor part being provided on the top surface of the core insulating layer; and a memory layer provided between the semiconductor layer and the stack in the first direction, wherein the first semiconductor part has an impurity semiconductor region containing an impurity element and overlapping with the second select gate line, and the semiconductor memory device further comprises:

a cap layer provided on the second semiconductor part, the cap layer containing silicon oxide; and a third semiconductor part provided on the cap layer.

2. The semiconductor memory device according to claim 1, wherein the impurity semiconductor region contains arsenic.

3. The semiconductor memory device according to claim 1, wherein the second select transistor is configured to cause Gate Induced Drain Leakage in response to a reverse bias voltage to be applied between the gate and a drain of the second select transistor.

4. The semiconductor memory device according to claim 1, wherein the cap layer is doped with an impurity.

5. The semiconductor memory device according to claim 4, wherein the impurity is one of phosphorus and arsenic.

* * * * *